US008392176B2

(12) United States Patent
Garudadri et al.

(10) Patent No.: US 8,392,176 B2
(45) Date of Patent: Mar. 5, 2013

(54) PROCESSING OF EXCITATION IN AUDIO CODING AND DECODING

(75) Inventors: Harinath Garudadri, San Diego, CA (US); Naveen B. Srinivasamurthy, Bangalore (IN); Petr Motlicek, Martigny-Croix (CH); Hynek Hermansky, Baltimore, MD (US)

(73) Assignee: QUALCOMM Incorporated, San Diego, CA (US)

( * ) Notice: Subject to any disclaimer, the term of this patent is extended or adjusted under 35 U.S.C. 154(b) by 1575 days.

(21) Appl. No.: 11/696,974

(22) Filed: Apr. 5, 2007

(65) Prior Publication Data

US 2007/0239440 A1 Oct. 11, 2007

Related U.S. Application Data

(60) Provisional application No. 60/791,042, filed on Apr. 10, 2006.

(51) Int. Cl.

| | |
|---|---|
| ***G10L 19/14*** | (2006.01) |
| ***G10L 11/04*** | (2006.01) |
| ***H03D 3/00*** | (2006.01) |
| ***H03D 1/24*** | (2006.01) |
| ***H03K 9/00*** | (2006.01) |
| ***H04B 1/26*** | (2006.01) |

(52) U.S. Cl. ........ 704/205; 704/206; 329/315; 329/343; 375/316; 375/321; 455/313; 455/323

(58) Field of Classification Search .................. 704/500
See application file for complete search history.

(56) References Cited

U.S. PATENT DOCUMENTS 4,184,049 A 1/1980 Crochiere et al.
4,192,968 A * 3/1980 Hilbert et al. .................. 381/15
4,584,534 A * 4/1986 Lijphart et al. ............... 329/308
4,849,706 A * 7/1989 Davis et al. .................. 329/304
4,902,979 A * 2/1990 Puckette, IV ................. 329/343
5,640,698 A * 6/1997 Shen et al. .................... 455/323
5,651,090 A 7/1997 Moriya et al.

(Continued)

FOREIGN PATENT DOCUMENTS

EP 0782128 A1 7/1997
EP 0867862 A2 9/1998

(Continued)

OTHER PUBLICATIONS

Qin Li; Atlas, L.; , "Properties for modulation spectral filtering," Acoustics, Speech, and Signal Processing, 2005. Proceedings. (ICASSP '05). IEEE International Conference on , vol. 4, No., pp. iv/521-iv/524 vol. 4, Mar. 18-23, 2005 doi: 10.1109/ICASSP.2005.1416060 URL: http://ieeexplore.ieee.org/stamp/stamp.jsp?tp=&arnumber=1416060&isnumber=3065.*

(Continued)

*Primary Examiner* — Pierre-Louis Desir
*Assistant Examiner* — Matthew Baker
(74) *Attorney, Agent, or Firm* — Espartaco Diaz Hidalgo

(57) ABSTRACT

In an apparatus and method, time-varying signals are processed and encoded via a frequency domain linear prediction (FDLP) scheme to arrive at an all-pole model. Residual signals resulted from the scheme are estimated and transformed into a time domain signal. Through the process of heterodyning, the time domain signal is frequency shifted toward the baseband level as a downshifted carrier signal. Quantized values of the all-pole model and the frequency transform of the downshifted carrier signal are packetized as encoded signals suitable for transmission or storage. To reconstruct the time-varying signals, the encoded signals are decoded. The decoding process is basically the reverse of the encoding process.

27 Claims, 12 Drawing Sheets

U.S. PATENT DOCUMENTS

| | | | | |
|---|---|---|---|---|
| 5,715,281 | A * | 2/1998 | Bly et al. | 375/344 |
| 5,764,704 | A * | 6/1998 | Shenoi | 375/324 |
| 5,778,338 | A | 7/1998 | Jacobs et al. | |
| 5,781,888 | A | 7/1998 | Herre | |
| 5,802,463 | A * | 9/1998 | Zuckerman | 455/208 |
| 5,825,242 | A * | 10/1998 | Prodan et al. | 329/304 |
| 5,838,268 | A * | 11/1998 | Frenkel | 341/111 |
| 5,884,010 | A | 3/1999 | Chen et al. | |
| 5,943,132 | A * | 8/1999 | Erskine | 356/484 |
| 6,014,621 | A | 1/2000 | Chen | |
| 6,091,773 | A * | 7/2000 | Sydorenko | 375/240.03 |
| 6,243,670 | B1 | 6/2001 | Bessho et al. | |
| 6,680,972 | B1 | 1/2004 | Liljeryd et al. | |
| 6,686,879 | B2 * | 2/2004 | Shattil | 342/367 |
| 7,155,383 | B2 | 12/2006 | Chen et al. | |
| 7,173,966 | B2 * | 2/2007 | Miller | 375/229 |
| 7,206,359 | B2 * | 4/2007 | Kjeldsen et al. | 375/316 |
| 7,430,257 | B1 * | 9/2008 | Shattil | 375/347 |
| 7,532,676 | B2 * | 5/2009 | Fonseka et al. | 375/265 |
| 7,639,921 | B2 | 12/2009 | Seo et al. | |
| 7,949,125 | B2 | 5/2011 | Shoval et al. | |
| 8,027,242 | B2 | 9/2011 | Garudadri et al. | |
| 2001/0044722 | A1 | 11/2001 | Gustafsson et al. | |
| 2003/0231714 | A1 * | 12/2003 | Kjeldsen et al. | 375/259 |
| 2004/0165680 | A1 * | 8/2004 | Kroeger | 375/321 |
| 2006/0122828 | A1 | 6/2006 | Lee et al. | |
| 2009/0177478 | A1 | 7/2009 | Jax et al. | |
| 2009/0198500 | A1 | 8/2009 | Garudadri et al. | |
| 2011/0270616 | A1 | 11/2011 | Garudadri et al. | |

FOREIGN PATENT DOCUMENTS

| | | | |
|---|---|---|---|
| EP | 1093113 | A2 | 4/2001 |
| EP | 1158494 | A1 | 11/2001 |
| EP | 1852849 | A1 | 11/2007 |
| JP | 62502572 | T | 10/1987 |
| JP | 3127000 | A | 5/1991 |
| JP | 6229234 | A | 8/1994 |
| JP | 7077979 | A | 3/1995 |
| JP | 7234697 | A | 9/1995 |
| JP | 08102945 | | 4/1996 |
| JP | 9258795 | | 10/1997 |
| JP | 2002032100 | A | 1/2002 |
| JP | 2003108196 | A | 4/2003 |
| JP | 2005173607 | A | 6/2005 |
| JP | 2005530206 | A | 10/2005 |
| JP | 2007506986 | T | 3/2007 |
| TW | 405328 | B | 9/2000 |
| TW | 442776 | | 6/2001 |
| TW | 454169 | | 9/2001 |
| TW | 454171 | | 9/2001 |
| TW | 200507467 | | 2/2005 |
| TW | 200529040 | | 9/2005 |
| TW | I242935 | | 11/2005 |
| TW | 200707275 | | 2/2007 |
| TW | 200727729 | | 7/2007 |
| WO | WO03107329 | A1 | 12/2003 |
| WO | WO2005027094 | A1 | 3/2005 |
| WO | 2005096274 | | 10/2005 |
| WO | WO2007128662 | A1 | 11/2007 |

OTHER PUBLICATIONS

N Derakhshan; MH Savoji. Perceptual Speech Enhancement Using a Hilbert Transform Based Time-Frequency Representation of Speech. SPECOM Jun. 25-29, 2006.* de Buda, R.; , "Coherent Demodulation of Frequency-Shift Keying with Low Deviation Ratio," Communications, IEEE Transactions on , vol. 20, No. 3, pp. 429-435, Jun. 1972 doi: 10.1109/TCOM.1972.1091177 URL: http://ieeexplore.ieee.org/stamp/stamp.jsp?tp=&arnumber=1091177&isnumber=23774.*

Athineos, M.; Ellis, D.P.W.; , "Frequency-domain linear prediction for temporal features," Automatic Speech Recognition and Understanding, 2003. ASRU '03. 2003 IEEE Workshop on , vol., No., pp. 261-266, Nov. 30-Dec. 3, 2003 doi: 10.1109/ASRU.2003.1318451.*

Athineos, Marios / Hermansky, Hynek / Ellis, Daniel P.W. (2004): "LP-TRAP: linear predictive temporal patterns", In Interspeech-2004, 949-952.*

S Schimmel, L Atlas. Coherent Envelope Detection for Modulation Filtering of Speech. Proceedings ICASSP 05 IEEE International Conference on Acoustics Speech and Signal Processing 2005 (2005) Vol. 1, Issue: 7, Publisher: IEEE, pp. 221-224.*

Tyagi, V.; Wellekens, C.; , "Fepstrum representation of speech signal," Automatic Speech Recognition and Understanding, 2005 IEEE Workshop on , vol., No., pp. 11-16, Nov. 27-27, 2005 doi: 10.1109/ASRU.2005.1566475.*

International Search Report, PCT/US2007/066243, Sep. 6, 2007.

Motlicek, P. et al., "Audio Coding Based on Long Temporal Contexts," IDIAP Research Report, [Online] Apr. 2006, Retrieved from the Internet: URL: http://www.idiap.ch/publications/motlicek-idiap-rr-06-30.bib.abs.html>[retrieved on Mar. 2, 2007].

Motlicek, Ullal, Hermansky: "Wide-Band Perceptual Audio Coding based on Frequency-Domain Linear Prediction" IDIAP Research Report, [Online] Oct. 2006. XP002423397 Retrieved from the Internet: URL:http://WWW.idiap.ch/publications/motlicek-idiap-rr-06-58.bib.abs.html> [retrieved on Mar. 2, 2007].

Kumaresan Ramdas et al: "Model based approach to envelope and positive instantaneous frequency estimation of signals with speech applications" Journal of the Acoustical Society of America, AIP / Acoustical Society of America, Melville, NY, US, vol. 105, No. 3, Mar. 1999, pp. 1812-1924. XP012000860 ISSN: 0001-4966 *section B, III* p. 1913, left-hand column, lines 3-6.

International Search Report~PCT/US06/060168—International Search Authority—European Patent Office.

Herre, J. et al. "Enhancing the Performance of Perceptual Audio Coders by Using Temporal Noise Shaping (TMS)" Preprints of papers presented at the AES convention, Nov. 8, 1996, pp. 1-24, p. 8, line 6—p. 11, line 21 figures 10, 14.

Schimmel S., Atlas L., "Coherent Envelope Detector for Modulation Filtering of Speech", in Proc. of ICASSP, vol. 1, pp. 221-224, Philadelphia, USA, May 2005.

Motlicek P., Hermansky H., Garudadri H., "Speech Coding Based on Spectral Dynamics", technical report IDIAP-RR 06-05, <http://www.idiap.ch>, Jan. 2006.

M. Athineos, et al, "Frequency-domain linear prediction for temporal features" Automatic Speech Recognition and Understanding, 2003. ASRU '03. 2003 IEEE Workshop on St. Thomas, V.I., USA, Nov. 30-Dec. 3, 2003, Piscataway, NJ, USA, IEEE, Nov. 30, 2003, pp. 261-265, XP010713319 ISBN: 0-7803-7980-2, the whole document.

Spanias A. S., "Speech Coding: A Tutorial Review" In Proc. of IEEE, vol. 82, No. 10, Oct. 1994.

Hermansky H, "Perceptual linear predictive (PLP) analysis for speech", J. Acoust. Soc. Am., vol. 87:4, pp. 1738-1752, 1990.

Mark S. Vinton and Les. E. Atlas, "A Scalable and Progressive Audio Codec", IEEE ICASSP 2001, May 7-11, 2001, Salt Lake City.

Hermansky H., Fujisaki H., Sato V., "Analysis and Synthesis of Speech Based on Spectral Transform Linear Predictive Method", In Proc. of ICASSP, vol. 8, pp. 777-780, Boston, USA, Apr. 1983.

Makhoul J, "Linear Prediction: A Tutorial Review", in Proc. of IEEE. vol. 63. No. 4, Apr. 1975.

Athineos M., Hermansky H., Ellis D. P. W., "LP-TRAP: Linear predictive temporal patterns", in Proc. of ICSLP, pp. 1154-1157, Jeju, S. Korea, Oct. 2004.

C. Loeffler, A. Ligtenberg, and G. S. Moschytz, "Algorithm-architecture mapping for custom DCT chips." in Proc. Int. Symp. Circuits Syst. (Helsinki, Finland), Jun. 1988, pp. 1953-1956.

Ephraim Feig, "A fast scaled-DCT algorithm", SPIE vol. 1244, Image Processing Algorithms and Techniques (1990), pp. 2-13.

ISO/IEC JTC1/SC29/WG11 N7335, "Call for Proposals on Fixed-Point 8x8 IDCT and DCT Standard," pp. 1-18, Poznan, Poland, Jul. 2005.

ISO/IEC JTC1/SC29/WG11 N7817 [23002-2 WD1] "Information technology—MPEG Video Technologies—Part 2: Fixed-point 8x8 IDCT and DCT transforms," Jan. 19, 2006, pp. 1-27.

ISO/IEC JTC1/SC29/WG11N7292 [11172-6 Study on FCD] Information Technology—Coding of Moving Pictures and Associated Audio for Digital Storage Media at up to About 1.5 Mbit/s—Part 6: Specification of Accuracy Requirements for Implementation of Integer Inverse Discrete Cosine Transform, IEEE standard 1180-1190, pp. 1-14, Approved Dec. 6, 1990.

M12984: Gary J. Sullivan, "On the project for a fixed-point IDCT and DCT standard", Jan. 2006, Bankok, Thailand.
M13004: Yuriy A. Reznik, Arianne T. Hinds, Honggang Qi, and Siwei Ma, "On Joint Implementation of Inverse Quantization and IDCT scaling", Jan. 2006, Bankok, Thailand.
M13005, Yuriy A. Reznik, "Considerations for choosing precision of MPEG fixed point 8x8 IDCT Standard" Jan. 2006, Bangkok, Thailand.
M13326: Yuriy A. Reznik and Arianne T. Hinds, "Proposed Core Experiment on Convergence of Scaled and Non-Scaled IDCT Architectures", Apr. 1, 2006, Montreux, Switzerland.
Taiwan Search Report TW096112540, Dec. 13, 2009.
W. Chen, C.H. Smith and S.C. Fralick, "A Fast Computational Algorithm for the Discrete Cosine Transform", IEEE Transactions on Communications, vol. com-25, No. 9, pp. 1004-1009, Sep. 1977.
Written Opinion—PCT/US2007/066243, International Search Authority, European Patent Office, Jun. 9, 2007.
Y.Arai, T. Agui, and M. Nakajima, "A Fast DCT-SQ Scheme for Images", Transactions of the IEICE vol. E 71, No. 11 Nov. 1988, pp. 1095-1097.
Athineos, Marios et al., "Frequency-Domain Linear Prediction for Temporal Features". Proceeding of ASRU-2003, Nov. 30-Dec. 4, 2003, St. Thomas USVI.
Athineos, Marios et al., "PLP2 Autoregressive modeling of auditory-like 2-D spectro-temporal patterns", Proceeding from Workshop n Statistical and Perceptual Audio Processing, SAPA-2004, paper 129, Oct. 3, 2004, Jeju, Korea.
Christensen, Mods Graesboll et al., "Computationally Efficient Amplitude Modulated Sinusoidal Audiocoding Using Frequency-Domain Linear Prediction", ICASSP 2006 Proceeding—Toulouse, France, IEEE Signal Processing Society, vol. 5, Issue , May 14-19, 2006 pp. V-V.
Fousek, Petr, "Doctoral Thesis: Extraction of Features for Automatic Recognition of Speech Based on Spectral Dynamics", Czech Technical University in Prague. Czech Republic, Mar. 2007.
Herre, Jurgen, "Temporal Noise Shaping, Quantization and Coding Methods in Perceptual Audio Coding: A Tutorial Introduction", Proceedings of the AES 17th International Conference: High-Quality Audio Coding, Florence, Italy, Sep. 2-5, 1999.
Jan Skoglund et al: "On Time-Frequency Masking in Voiced Speech" IEEE Transactions on Speech and Audio Processing, IEEE Service Center, New York NY, US, vol. 8, No. 4, Jul. 1, 2000, XP011054031.
Jesteadt, Walt at al., °Forward Masking as a Function of Frequency, Masker Level and Signal Delay, J. Acoust. Soc. Am., 71(4), Apr. 1982, pp. 950-962.
Johnston J D: "Transform Coding of Audio Signals Using Perceptual Noise Criteria" IEEE Journal on Selected Areas i n Communications, IEEE Service Center, Piscataway, US, vol. 6, No. 2, Feb. 1, 1988, pp. 314-323, XP002003779.
Marios Athineos & Daniel P.W. Ellis: "Autoregressive modeling of temporal envelopes", IEEE Transactions on Signal Processing IEEE Service Center, New York, NY, US—ISSN 1053-587X, Jun. 2007, pp. 1-9, XP002501759.
Motlicek, Petr at al., "Speech Coding Based on Spectral Dynamics", Lecture Notes in Computer Science, vol. 4188/2006. Springer/Berlin/Heidelberg, DE, Sep. 2006.
Motlicek, Petr et al., "Wide-Band Perceptual Audio Coding Based on Frequency-Domain Linear Prediction", Proceeding of ICASSP 2007, IEEE Signal Processing Society, Apr. 2007, pp. 1-265-1-268.
Sinaga F et al: "Wavelet packet based audio coding using temporal masking" Information, Communications and Signal Processing, 2003 and Fourth Pacific Rim Conference on Multimedia. Proceedings of the 2003 Joint Confe rence of the Fourth International Conference on Singapore Dec. 15-18, 2003, Piscataway, NJ, USA, IEEE, vol. 3, Dec. 15, 2003, pp. 1380-1383, XP010702139.
Sriram Ganapathy et al: "Temporal masking for bit-rate reduction in audio codec based on Frequency Domain Linear Prediction" Acoustics, Speech and Signal Processing, 2008. ICASSP 2008. IEEE International Conference on, IEEE, Piscataway, NJ, USA, Mar. 31, 2008, pp. 4781-4784, XP031251668.
Zwicker, et al., "Psychoacoustics Facts and Models," Second Updated Edition with 289 Figures, pp. 78-110, Jan. 1999.

* cited by examiner

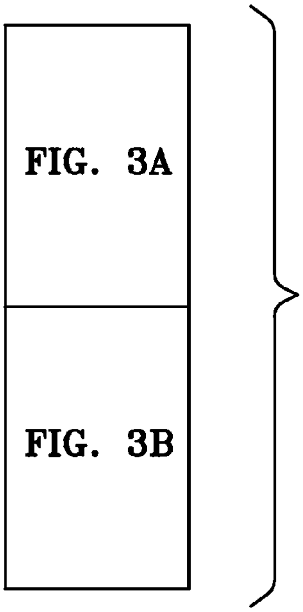
FIG. 3
FIG. 3A
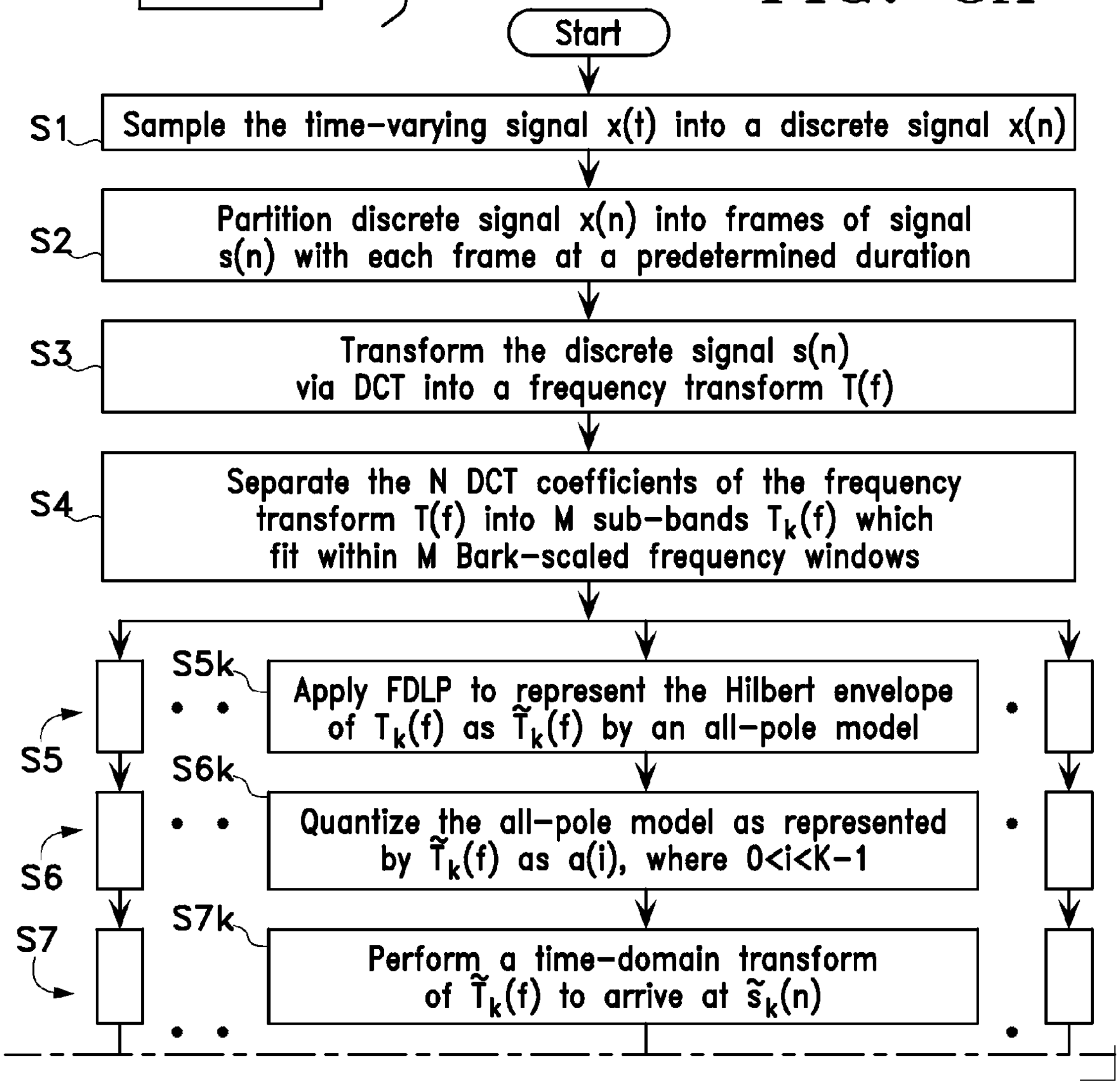

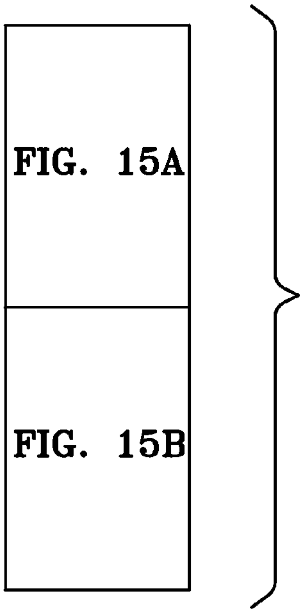
FIG. 15
FIG. 15A
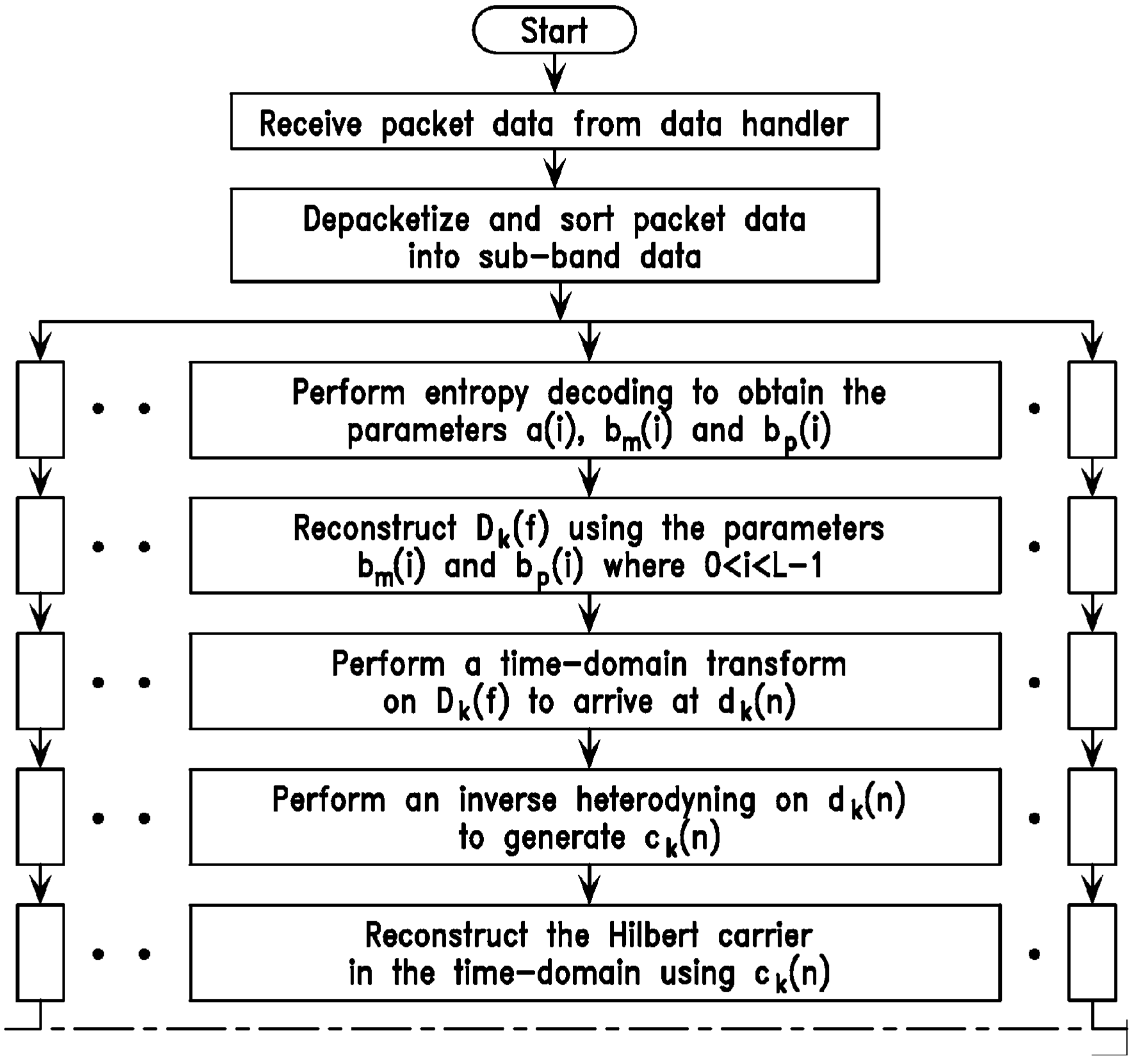

PROCESSING OF EXCITATION IN AUDIO CODING AND DECODING

CLAIM OF PRIORITY UNDER 35 U.S.C §119

The present application for patent claims priority to U.S. Provisional Application No. 60/791,042, entitled "Processing of Excitation in Audio Coding Based on Spectral Dynamics in Sub-Bands," filed on Apr. 10, 2006, and assigned to the assignee hereof and expressly incorporated by reference herein.

BACKGROUND

I. Field

The present invention generally relates to signal processing, and more particularly, to encoding and decoding of signals for storage and retrieval or for communications.

II. Background

In digital telecommunications, signals need to be coded for transmission and decoded for reception. Coding of signals concerns with converting the original signals into a format suitable for propagation over the transmission medium. The objective is to preserve the quality of the original signals but at a low consumption of the medium's bandwidth. Decoding of signals involves the reverse of the coding process.

A known coding scheme uses the technique of pulse-code modulation (PCM). Referring to FIG. 1 which shows a time-varying signal x(t) that can be a segment of a speech signal, for instance. The y-axis and the x-axis represent the amplitude and time, respectively. The analog signal x(t) is sampled by a plurality of pulses 20. Each pulse 20 has an amplitude representing the signal x(t) at a particular time. The amplitude of each of the pulses 20 can thereafter be coded in a digital value for later transmission, for example.

To conserve bandwidth, the digital values of the PCM pulses 20 can be compressed using a logarithmic compounding process prior to transmission. At the receiving end, the receiver merely performs the reverse of the coding process mentioned above to recover an approximate version of the original time-varying signal x(t). Apparatuses employing the aforementioned scheme are commonly called the a-law or μ-law codecs.

As the number of users increases, there is a further practical need for bandwidth conservation. For instance, in a wireless communication system, a multiplicity of users can be sharing a finite frequency spectrum. Each user is normally allocated a limited bandwidth among other users.

In the past decade or so, considerable progress has been made in the development of speech coders. A commonly adopted technique employs the method of code excited linear prediction (CELP). Details of CELP methodology can be found in publications, entitled "Digital Processing of Speech Signals," by Rabiner and Schafer, Prentice Hall, ISBN: 0132136031, September 1978; and entitled "Discrete-Time Processing of Speech Signals," by Deller, Proakis and Hansen, Wiley-IEEE Press, ISBN: 0780353862, September 1999. The basic principles underlying the CELP method is briefly described below.

Reference is now returned to FIG. 1. Using the CELP method, instead of digitally coding and transmitting each PCM sample 20 individually, the PCM samples 20 are coded and transmitted in groups. For instance, the PCM pulses 20 of the time-varying signal x(t) in FIG. 1 are first partitioned into a plurality of frames 22. Each frame 22 is of a fixed time duration, for instance 20 ms. The PCM samples 20 within each frame 22 is collectively coded via the CELP scheme and thereafter transmitted. Exemplary frames of the sampled pulses are PCM pulse groups 22A-22C shown in FIG. 1.

For simplicity, take only the three PCM pulse groups 22A-22C for illustration. During encoding prior to transmission, the digital values of the PCM pulse groups 22A-22C are consecutively fed to a linear predictor (LP) module. The resultant output is a set of frequency values, also called a "LP filter" or simply "filter" which basically represents the spectral content of the pulse groups 22A-22C. The LP filter is then quantized.

The LP module generates an approximation of the spectral representation of the PCM pulse groups 22A-22C. As such, during the predicting process, errors or residual values are introduced. The residual values are mapped to a codebook which carries entries of various combinations available for close matching of the coded digital values of the PCM pulse groups 22A-22C. The best fitted values in the codebook are mapped. The mapped values are the values to be transmitted. The overall process is called time-domain linear prediction (TDLP).

Thus, using the CELP method in telecommunications, the encoder (not shown) merely has to generate the LP filters and the mapped codebook values. The transmitter needs only to transmit the LP filters and the mapped codebook values, instead of the individually coded PCM pulse values as in the a- and μ-law encoders mentioned above. Consequently, substantial amount of communication channel bandwidth can be saved.

On the receiver end, it also has a codebook similar to that in the transmitter. The decoder (not shown) in the receiver, relying on the same codebook, merely has to reverse the encoding process as aforementioned. Along with the received LP filters, the time-varying signal x(t) can be recovered.

Heretofore, many of the known speech coding schemes, such as the CELP scheme mentioned above, are based on the assumption that the signals being coded are short-time stationary. That is, the schemes are based on the premise that frequency contents of the coded frames are stationary and can be approximated by simple (all-pole) filters and some input representation in exciting the filters. The various TDLP algorithms in arriving at the codebooks as mentioned above are based on such a model. Nevertheless, voice patterns among individuals can be very different. Non-human audio signals, such as sounds emanated from various musical instruments, are also distinguishably different from that of the human counterparts. Furthermore, in the CELP process as described above, to expedite real-time signal processing, a short time frame is normally chosen. More specifically, as shown in FIG. 1, to reduce algorithmic delays in the mapping of the values of the PCM pulse groups, such as 22A-22C, to the corresponding entries of vectors in the codebook, a short time window 22 is defined, for example 20 ms as shown in FIG. 1. However, derived spectral or formant information from each frame is mostly common and can be shared among other frames. Consequently, the formant information is more or less repetitively sent through the communication channels, in a manner not in the best interest for bandwidth conservation.

Accordingly, there is a need to provide a coding and decoding scheme with improved preservation of signal quality, applicable not only to human speeches but also to a variety of other sounds, and further for efficient utilization of channel resources.

Copending U.S. patent application Ser. No. 11/583,537, assigned to the same assignee as the current application, addresses the aforementioned need by using a frequency domain linear prediction (FDLP) scheme which first converts a time-varying signal into a frequency-domain signal. The envelope and the carrier portions of the frequency-domain signal are then identified. The frequency-domain signal is then sorted into a plurality of sub-bands. The envelope portion is approximated by the FDLP scheme as an all-pole model. The carrier portion, which also represents the residual of the all-pole model, is approximately estimated. Resulted data of the all-pole model signal envelope and the estimated carrier are packetized as encoded signals suitable for transmission or storage. To reconstruct the time-varying signals, the encoded signals are decoded. The decoding process is basically the reverse of the encoding process.

For improved signal quality, the signal carrier can be more accurately determined prior to packetization and encoding, yet at substantially no extra consumption of additional bandwidth.

SUMMARY

In an apparatus and method, a time-varying signal is partitioned into sub-bands. Each sub-band is processed and encoded via a frequency domain linear prediction (FDLP) scheme to arrive at an all-pole model. Residual signal resulted from the scheme in each sub-band is estimated. The all-pole model and the residual signal represent the Hilbert envelope and the Hilbert carrier, respectively, in each sub-band. Through the process of heterodyning, the time-domain residual signal is frequency shifted toward the baseband level as a downshifted carrier signal. Quantized values of the all-pole model and the downshifted carrier signal are packetized as encoded signals suitable for transmission or storage. To reconstruct the time-varying signals, the encoded signals are decoded. The decoding process is basically the reverse of the encoding process.

The partitioned frames can be chosen to be relatively long in duration resulting in more efficient use of format or common spectral information of the signal source. The apparatus and method implemented as described are suitable for use not only to vocalic voices but also for other sounds, such as sounds emanated from various musical instruments, or combination thereof.

These and other features and advantages will be apparent to those skilled in the art from the following detailed description, taken together with the accompanying drawings, in which like reference numerals refer to like parts.

DETAILED DESCRIPTION

The following description is presented to enable any person skilled in the art to make and use the invention. Details are set forth in the following description for purpose of explanation. It should be appreciated that one of ordinary skill in the art would realize that the invention may be practiced without the use of these specific details. In other instances, well known structures and processes are not elaborated in order not to obscure the description of the invention with unnecessary details. Thus, the present invention is not intended to be limited by the embodiments shown, but is to be accorded with the widest scope consistent with the principles and features disclosed herein.

Figure 1:
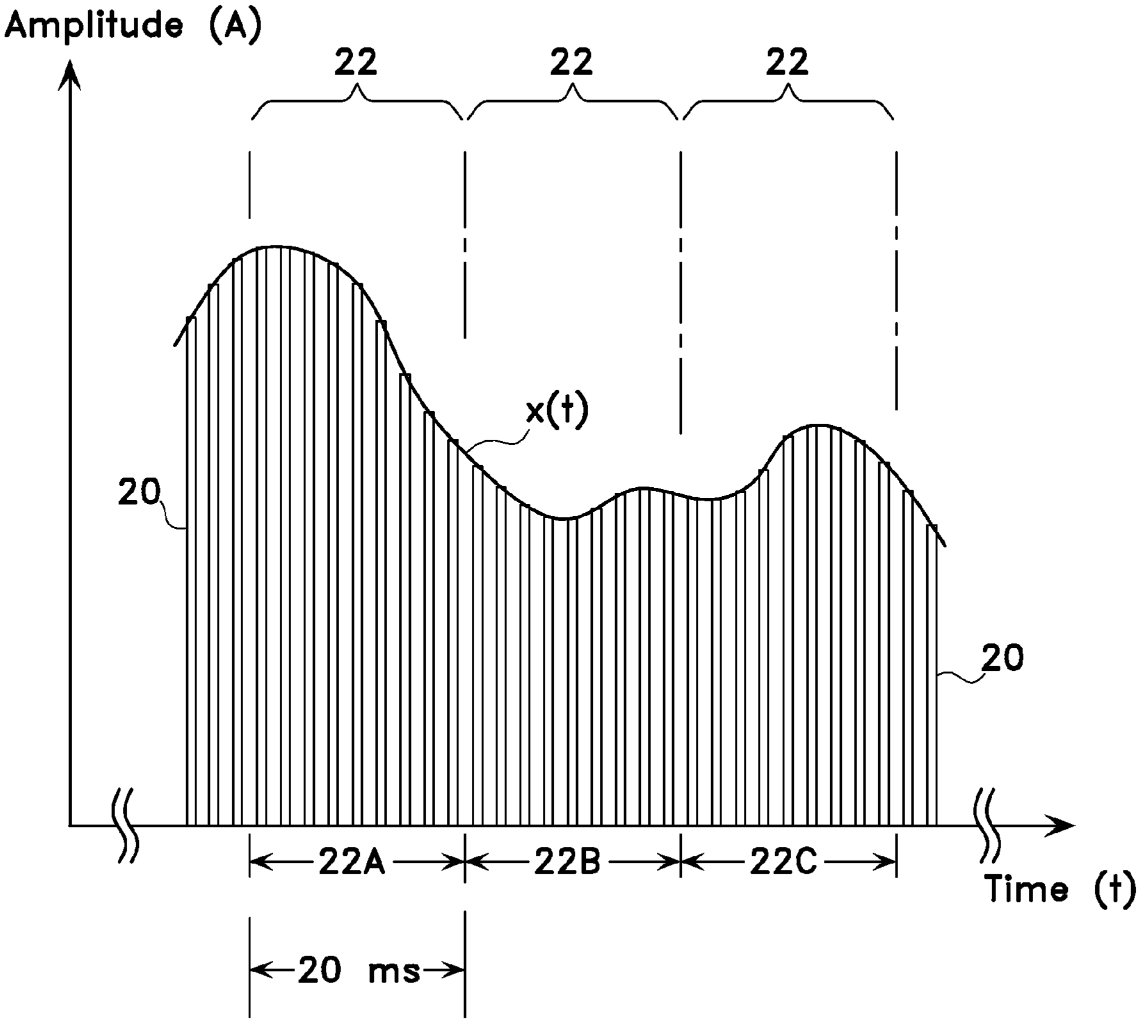
FIG. 1 shows a graphical representation of a time-varying signal sampled into a discrete signal.
Figure 2:
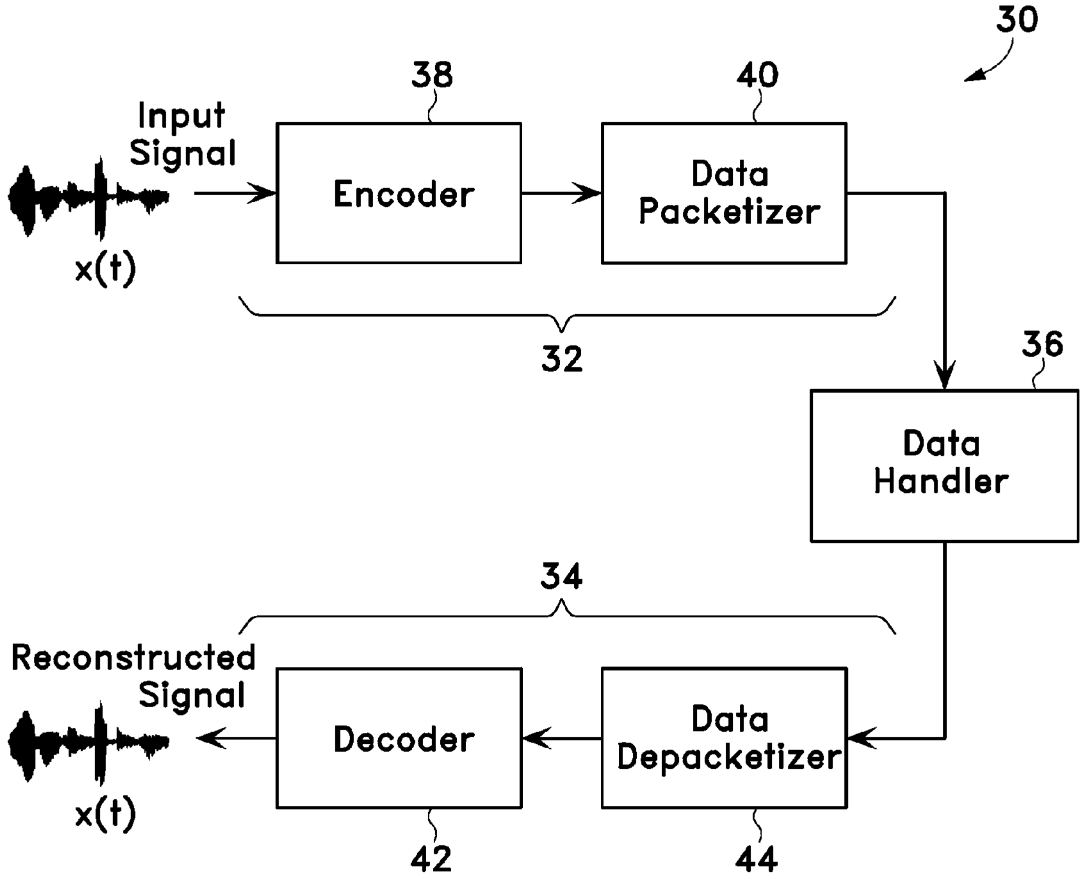
FIG. 2 is a general schematic diagram showing the hardware implementation of the exemplified embodiment of the invention.

FIG. 2 is a general schematic diagram of hardware for implementing the exemplified embodiment of the invention. The system is overall signified by the reference numeral 30. The system 30 can be approximately divided into an encoding section 32 and a decoding section 34. Disposed between the sections 32 and 34 is a data handler 36. Examples of the data handler 36 can be a data storage device or a communication channel.

In the encoding section 32, there is an encoder 38 connected to a data packetizer 40. A time-varying input signal x(t), after passing through the encoder 38 and the data packetizer 40 are directed to the data handler 36.

In a somewhat similar manner but in the reverse order, in the decoding section 34, there is a decoder 42 tied to a data depacketizer 44. Data from the data handler 36 are fed to the data depacketizer 44 which in turn sends the depacketized data to the decoder 42 for the reconstruction of the original time-varying signal x(t).

Figure 3B:
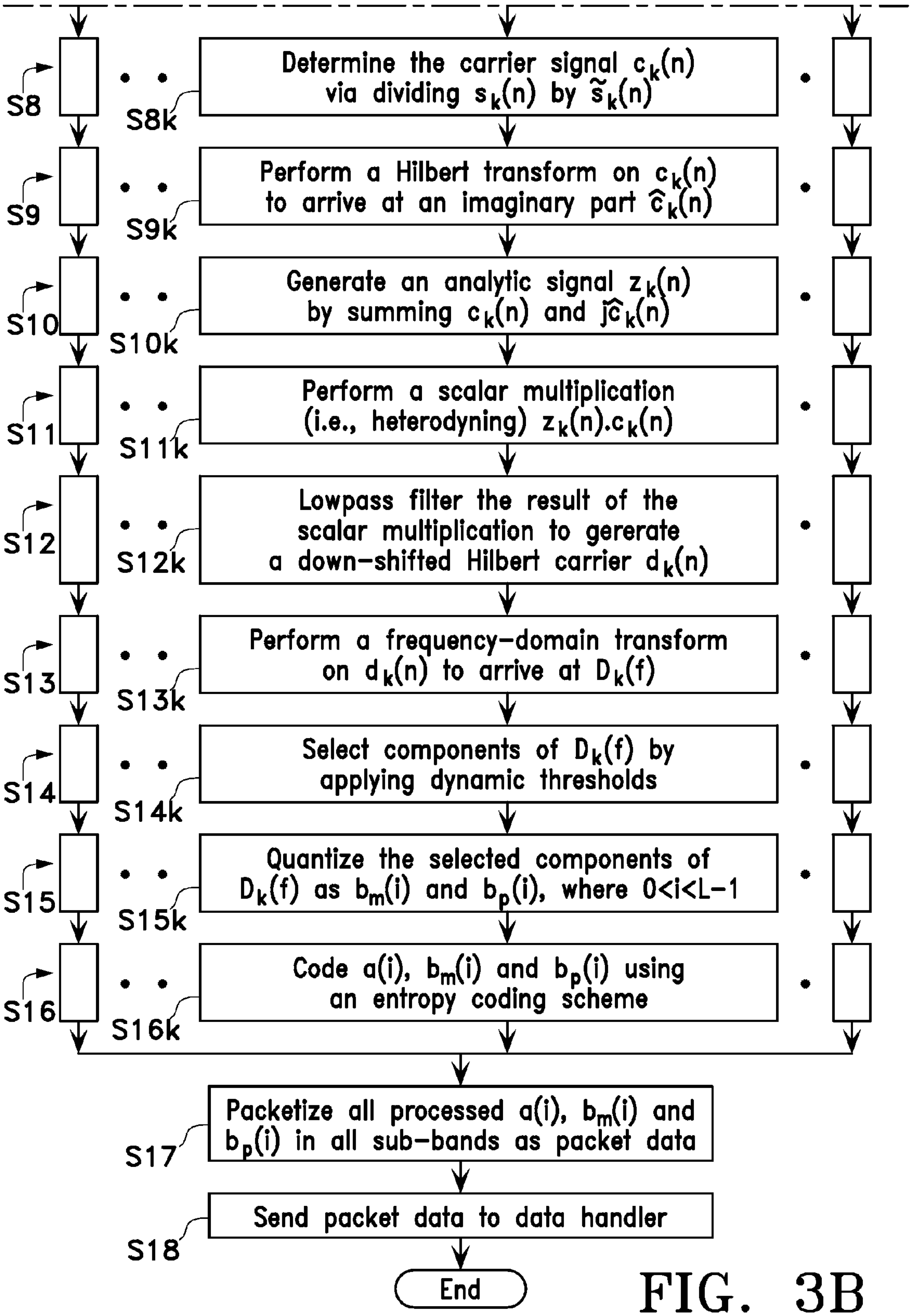
FIG. 3 is flowchart illustrating the steps involved in the encoding process of the exemplified embodiment.

FIG. 3 is a flow diagram illustrating the steps of processing involved in the encoding section 32 of the system 30 shown in FIG. 2. In the following description, FIG. 3 is referred to in conjunction with FIGS. 4-14.

Figure 4:
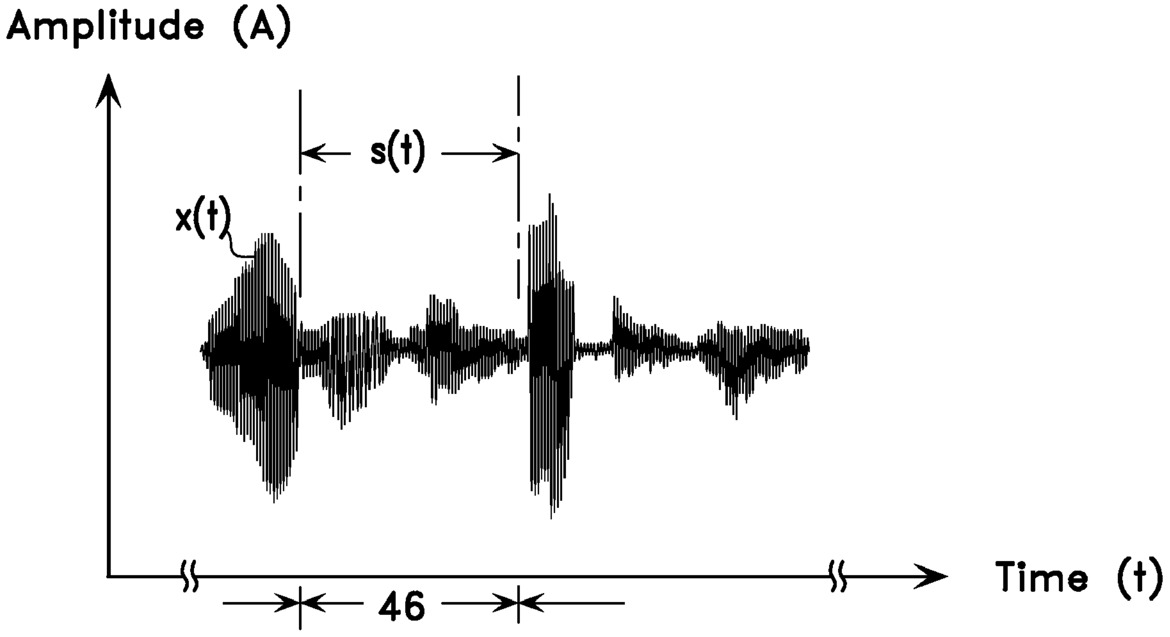
FIG. 4 is a graphical representation of a time-varying signal partitioned into a plurality of frames.

In step S1 of FIG. 3, the time-varying signal x(t) is first sampled, for example, via the process of pulse-code modulation (PCM). The discrete version of the signal x(t) is represented by x(n). In FIG. 4, only the continuous signal x(t) is shown. For the sake of clarity so as not to obscure FIG. 4, the multiplicity of discrete pulses of x(n) are not shown.

In this specification and the appended claims, unless specifically specified wherever appropriate, the term "signal" is broadly construed. Thus the term signal includes continuous and discrete signals, and further frequency-domain and time-domain signals. Moreover, hereinbelow, lower-case symbols denote time-domain signals and upper-case symbols denote frequency-transformed signals. The rest of the notation will be introduced in subsequent description.

Progressing into step S2, the sampled signal x(n) is partitioned into a plurality of frames. One of such frame is signified by the reference numeral 46 as shown in FIG. 4. In the exemplary embodiment, the time duration for the frame 46 is chosen to be 1 second.

Figure 5:
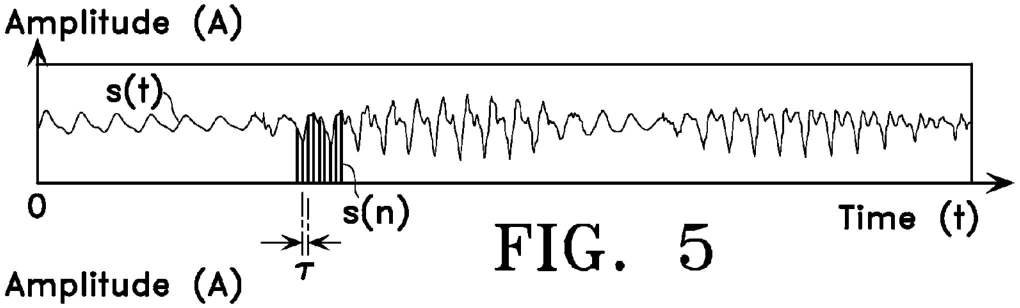
FIG. 5 is a graphical representation of a segment of the time-varying signal of FIG. 4.

The time-varying signal within the selected frame 46 is labeled s(t) in FIG. 4. The continuous signal s(t) is highlighted and duplicated in FIG. 5. It should be noted that the signal segment s(t) shown in FIG. 5 has a much elongated time scale compared with the same signal segment s(t) as illustrated in FIG. 4. That is, the time scale of the x-axis in FIG. 5 is significantly stretched apart in comparison with the corresponding x-axis scale of FIG. 4. The reverse holds true for the y-axis.

The discrete version of the signal s(t) is represented by s(n), where n is an integer indexing the sample number. Again, for reason of clarity so as not to obscure the drawing figure, only a few samples of s(n) are shown in FIG. 5. The time-continuous signal s(t) is related to the discrete signal s(n) by the following algebraic expression:

$$s(t)=s(n\tau) \quad (1)$$

where τ is the sampling period as shown in FIG. 5.

Progressing into step S3 of FIG. 3, the sampled signal s(n) undergoes a frequency transform. In this embodiment, the method of discrete cosine transform (DCT) is employed. However, other types of transforms, such as various types of orthogonal, non-orthogonal and signal-dependent transforms well-known in the art can be used. Hereinbelow, in this specification and the appended claims, the terms "frequency transform" and "frequency-domain transform" are used interchangeably. Likewise, the terms "time transform" and "time-domain transform" are used interchangeably. Mathematically, the transform of the discrete signal s(n) from the time domain into the frequency domain via the DCT process can be expressed as follows:

$$T(f)=c(f)\sum_{n=0}^{N-1}s(n)\cos\frac{\pi(2n+1)f}{2N} \quad (2)$$

where s(n) is as defined above, f is the discrete frequency in which 0≦f≦N, T is the linear array of the N transformed values of the N pulses of s(n), and the coefficients c are given by $c(0)=\sqrt{1/N}$, $c(f)=\sqrt{2/N}$ for 1≦f≦N−1 .

Figure 6:
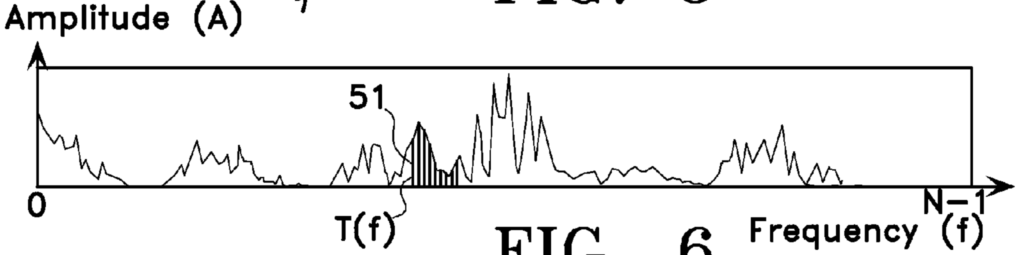
FIG. 6 is a frequency-transform of the signal shown in FIG. 5.

After the DCT of the time-domain parameter of s(n), the resultant frequency-domain parameter T(f) is diagrammatically shown in FIG. 6 and is designated by the reference numeral 51. The N pulsed samples of the frequency-domain transform T(f) in this embodiment are called DCT coefficients. Again, only few DCT coefficients are shown in FIG. 6.

Figure 11:
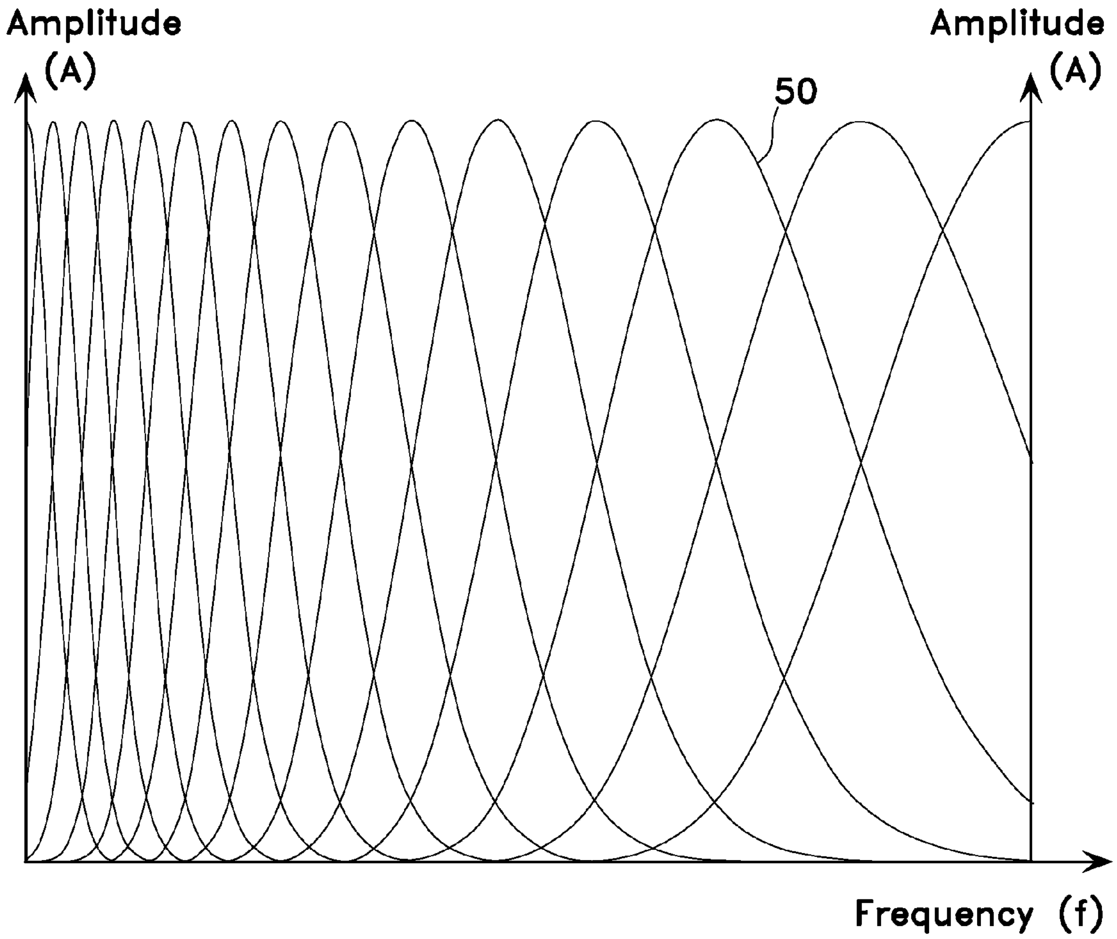
FIG. 11 is a graphical representation of a plurality of overlapping Gaussian windows for sorting the transformed data for a plurality of sub-bands.

Entering into step S4 of FIG. 3, the N DCT coefficients of the DCT transform T(f) are grouped and thereafter fitted into a plurality of frequency sub-band windows. The relative arrangement of the sub-band windows is shown in FIG. 11. Each sub-band window, such as the sub-band window 50, is represented as a variable-size window. In the exemplary embodiment, Gaussian distributions are employed to represent the sub-bands. As illustrated, the centers of the sub-band windows are not linearly spaced. Rather, the windows are separated according to a Bark scale, that is, a scale implemented according to certain known properties of human perceptions. Specifically, the sub-band windows are narrower at the low-frequency end than at the high-frequency end. Such an arrangement is based on the finding that the sensory physiology of the mammalian auditory system is more attuned to the narrower frequency ranges at the low end than the wider frequency ranges at the high end of the audio frequency spectrum. It should be noted that other approaches of grouping the sub-bands can also be practical. For example, the sub-bands can be of equal bandwidths and equally spaced, instead of being grouped in accordance with the Bark scale as described in this exemplary embodiment.

In selecting the number of sub-bands M, there should be a balance between complexity and signal quality. That is, if a higher quality of the encoded signal is desired, more sub-bands can be chosen but at the expense of more packetized data bits and further a more complex dealing of the residual signal, both will be explained later. On the other hand, fewer numbers of sub-bands may be selected for the sake of simplicity but may result in the encoded signal with relatively lower quality. Furthermore, the number of sub-bands can be chosen as dependent on the sampling frequency. For instance, when the sampling frequency is at 16,000 Hz, M can be selected to be 15. In the exemplary embodiment, the sampling frequency is chosen to be 8,000 Hz and with M set at 13 (i.e., M=13).

After the N DCT coefficients are separated and fitted into the M sub-bands in the form of M overlapping Gaussian windows, as shown in FIG. 11 and as mentioned above, the separated DCT coefficients in each sub-bands need to be further processed. The encoding process now enters into steps S5-S16 of FIG. 3. In this embodiment, each of the steps S5-S16 includes processing M sets of sub-steps in parallel. That is, the processing of the M sets of sub-steps is more or less carried out simultaneously. Hereinbelow, for the sake of clarity and conciseness, only the set involving the sub-steps S5*k*-S16*k* for dealing with the $k^{th}$ sub-band is described. It should be noted that processing of other sub-band sets is substantially similar.

In the following description of the embodiment, M=13 and 1≦k≦M in which k is an integer. In addition, the DCT coefficients sorted in the $k^{th}$ sub-band is denoted $T_k(f)$, which is a frequency-domain term. The DCT coefficients in the $k^{th}$ sub-band $T_k(f)$ has its time-domain counterpart, which is expressed as $s_k(n)$.

At this juncture, it helps to make a digression to define and distinguish the various frequency-domain and time-domain terms.

The time-domain signal in the $k^{th}$ sub-band $s_k(n)$ can be obtained by an inverse discrete cosine transform (IDCT) of its corresponding frequency counterpart $T_k(f)$. Mathematically, it is expressed as follows:

$$s_k(n)=\sum_{f=0}^{N-1}c(f)T_k(f)\cos\frac{\pi(2n+1)f}{2N} \quad (3)$$

where $s_k(n)$ and $T_k(f)$ are as defined above. Again, f is the discrete frequency in which 0≦f≦N, and the coefficients c are given by $c(0)=\sqrt{1/N}$, $c(f)=\sqrt{2/N}$. for 1≦f≦N−1.

Figure 7:
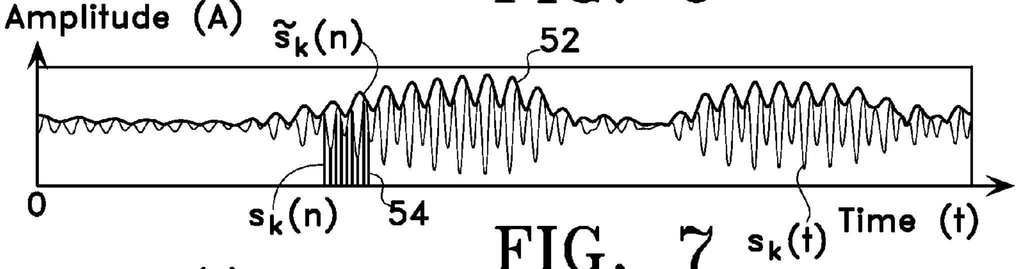
FIG. 7 is a graphical representation of a sub-band signal of the time-varying signal shown in FIG. 5, the envelope portion of the sub-band signal is also shown.
Figure 8:
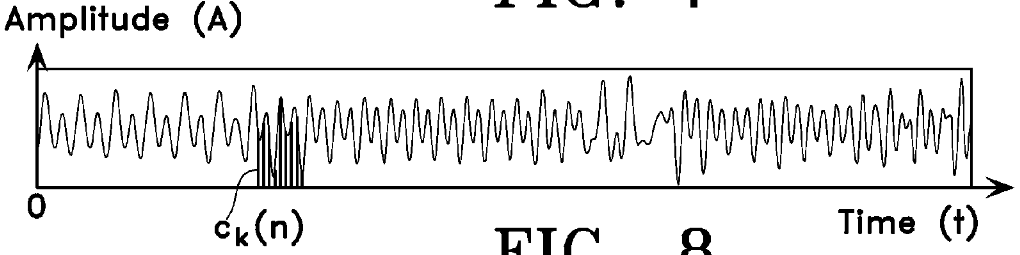
FIG. 8 is a graphical representation of the carrier portion of the sub-band signal of FIG. 7.

Switching the discussion from the frequency domain to the time domain, the time-domain signal in the $k^{th}$ sub-band $s_k(n)$ essentially composes of two parts, namely, the time-domain Hilbert envelope $\tilde{s}_k(n)$ and the Hilbert carrier $c_k(n)$. The time-domain Hilbert envelope $\tilde{s}_k(n)$ is diagrammatically shown in FIG. 7. However, again for reason of clarity, the discrete components of Hilbert envelope $\tilde{s}_k(n)$ is not shown but rather the signal envelope is labeled and as denoted by the reference numeral 52 in FIG. 7. Loosely stated, underneath the Hilbert envelope $\tilde{s}_k(n)$ is the carrier signal which is sometimes called the excitation. Stripping away the Hilbert envelope $\tilde{s}_k(n)$, the carrier signal, or the Hilbert carrier $c_k(n)$, is shown in FIG. 8. Put another way, modulating the Hilbert carrier $c_k(n)$ as shown FIG. 8 with the Hilbert envelope $\tilde{s}_k(n)$ as shown in FIG. 7 will result in the time-domain signal in the $k^{th}$ sub-band $s_k(n)$ as shown in FIG. 7. Algebraically, it can be expressed as follows:

$$s_k(n)=\tilde{s}_k(n)c_k(n) \tag{4}$$

Thus, from equation (4), if the time-domain Hilbert envelope $\tilde{s}_k(n)$ and the Hilbert carrier $c_k(n)$ are known, the time-domain signal in the $k^{th}$ sub-band $s_k(n)$ can be reconstructed. The reconstructed signal approximates that of a lossless reconstruction.

Figure 9:
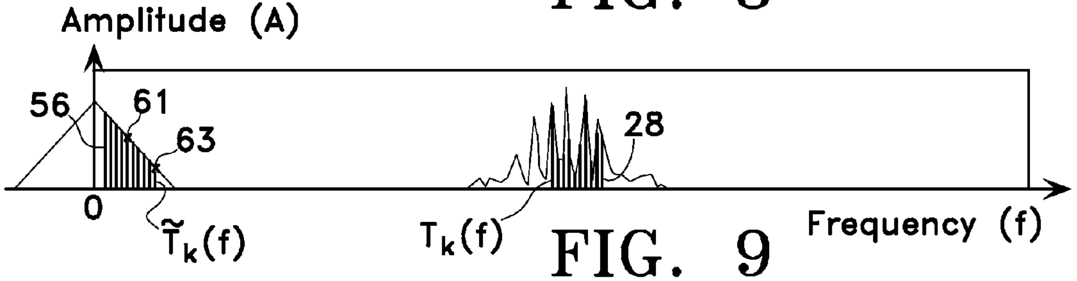
FIG. 9 is a graphical representation of the frequency-domain transform of the sub-band signal of FIG. 7, an estimated all-pole model of the frequency-domain transform is also shown.

The diagrammatical relationship between the time-domain signal $s_k(n)$ and its frequency-domain counterpart $T_k(f)$ can also be seen from FIGS. 7 and 9. In FIG. 7, the time-domain signal $s_k(n)$ is shown and is also signified by the reference numeral 54. FIG. 9 illustrates the frequency-domain transform $T_k(f)$ of the time-domain signal $s_k(n)$ of FIG. 7. The parameter $T_k(f)$ is also designated by the reference numeral 28. The frequency-domain transform $T_k(f)$ can be generated from the time-domain signal $s_k(n)$ via the DCT for example, as mentioned earlier.

Returning now to FIG. 3, sub-steps S5*k* and S6*k* basically relate to determining the Hilbert envelope $\tilde{s}_k(n)$ and the Hilbert carrier $c_k(n)$ in the sub-band k. Specifically, sub-steps S5*k* and S6*k* deal with evaluating the Hilbert envelope $\tilde{s}_k(n)$, and sub-steps S7*k*-S16*k* concern with calculating the Hilbert carrier $c_k(n)$. As described above, once the two parameters $\tilde{s}_k(n)$ and $c_k(n)$ are known, the time-domain signal in the $k^{th}$ sub-band $s_k(n)$ can be reconstructed in accordance with Equation (4).

As also mentioned earlier, the time-domain term Hilbert envelope $\tilde{s}_k(n)$ in the $k^{th}$ sub-band can be derived from the corresponding frequency-domain parameter $T_k(f)$. However, in sub-step S5*k*, instead of using the IDCT process for the exact transformation of the parameter $T_k(f)$, the process of frequency-domain linear prediction (FDLP) of the parameter $T_k(f)$ is employed in the exemplary embodiment. Data resulted from the FDLP process can be more streamlined, and consequently more suitable for transmission or storage.

In the following paragraphs, the FDLP process is briefly described followed with a more detailed explanation.

Briefly stated, in the FDLP process, the frequency-domain counterpart of the Hilbert envelope $\tilde{s}_k(n)$ is estimated, the estimated counterpart is algebraically expressed as $\tilde{T}_k(f)$ and is shown and labeled 56 in FIG. 9. It should be noted that the parameter $\tilde{T}_k(f)$ is frequency-shifted toward the baseband since the parameter $\tilde{T}_k(f)$ is a frequency transform of the Hilbert envelope $\tilde{s}_k(n)$ which essentially is deprived of any carrier information. However, the signal intended to be encoded is $s_k(n)$ which has carrier information. The exact (i.e., not estimated) frequency-domain counterpart of the parameter $s_k(n)$ is $T_k(f)$ which is also shown in FIG. 9 and is labeled 28. As shown in FIG. 9 and will also be described further below, since the parameter $\tilde{T}_k(f)$ is an approximation, the difference between the approximated value $\tilde{T}_k(f)$ and the actual value $T_k(f)$ can also be determined, which difference is expressed as $C_k(f)$. The parameter $C_k(f)$ is called the frequency-domain Hilbert carrier, and is also sometimes called the residual value.

Hereinbelow, further details of the FDLP process and the estimating of the parameter $C_k(f)$ are described.

In the FDLP process, the algorithm of Levinson-Durbin can be employed. Mathematically, the parameters to be estimated by the Levinson-Durbin algorithm can be expressed as follows:

$$H(z)=\frac{1}{1+\sum_{i=0}^{K-1} a(i)z^{-k}} \tag{5}$$

in which H(z) is a transfer function in the z-domain; z is a complex variable in the z-domain; a(i) is the $i^{th}$ coefficient of the all-pole model which approximates the frequency-domain counterpart $\tilde{T}_k(f)$ of the Hilbert envelope $\tilde{s}_k(n)$; i=0, . . . , K−1.

Fundamentals of the Z-transform in the z-domain can be found in a publication, entitled "Discrete-Time Signal Processing," $2^{nd}$ Edition, by Alan V. Oppenheim, Ronald W. Schafer, John R. Buck, Prentice Hall, ISBN: 0137549202, and is not further elaborated in here.

In equation (5), the value of K can be selected based on the length of the frame 46 (FIG. 4). In the exemplary embodiment, K is chosen to be 20 with the time duration of the frame 46 set at 1 sec.

Figure 12:
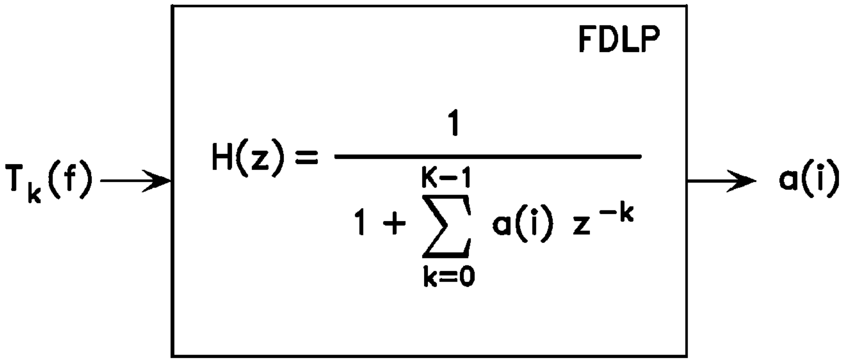
FIG. 12 is a graphical representation showing the frequency-domain linear prediction process.

In essence, in the FDLP process as exemplified by Equation (5), the DCT coefficients of the frequency-domain transform in the $k^{th}$ sub-band $T_k(f)$ are processed via the Levinson-Durbin algorithm resulting in a set of coefficients a(i), where $0 \leqq i \leqq K-1$. The set of coefficients a(i) represents the frequency counterpart $\tilde{T}_k(f)$ (FIG. 9) of the time-domain Hilbert envelope $\tilde{s}_k(n)$ (FIG. 7). Diagrammatically, the FDLP process is shown in FIG. 12.

The Levinson-Durbin algorithm is well known in the art and is also not explained in here. The fundamentals of the algorithm can be found in a publication, entitled "Digital Processing of Speech Signals," by Rabiner and Schafer, Prentice Hall, ISBN: 0132136031, September 1978.

Advancing into sub-step S6*k* of FIG. 3, the resultant coefficients a(i) are quantized. That is, for each value a(i), a close fit is identified from a codebook (not shown) to arrive at an approximate value. The process is called lossy approximation. During quantization, either the entire vector of a(i), where i=0 to i=K−1, can be quantized, or alternatively, the whole vector can be segmented and quantized separately. Again, the quantization process via codebook mapping is also well known and need not be further elaborated.

The result of the FDLP process is the parameter $\tilde{T}_k(f)$, which as mentioned above, is the Hilbert envelope $\tilde{s}_k(n)$ expressed in the frequency-domain term. The parameter $\tilde{T}_k(f)$ is identified by the reference numeral 56 in FIG. 9. The quantized coefficients a(i) of the parameter $\tilde{T}_k(f)$ can also be graphically displayed in FIG. 9, wherein two of which are labeled 61 and 63 riding the envelope of the parameter $\tilde{T}_k(f)$ 56.

The quantized coefficients a(i), where i=0 to K−1, of the parameter $\tilde{T}_k(f)$ will be part of the encoded information to be sent to the data handler 36 (FIG. 2).

As mentioned above and repeated in here, since the parameter $\tilde{T}_k(f)$ is a lossy approximation of the original parameter $T_k(f)$, the difference between the two parameters can be captured and represented as the residual value, which is algebraically expressed as $C_k(f)$. Differently put, in the fitting process in sub-steps S5$k$ and S6$k$ via the Levinson-Durbin algorithm as aforementioned to arrive at the all-pole model, some information about the original signal cannot be captured. If signal encoding of high quality is intended, that is, if a lossless encoding is desired, the residual value $C_k(f)$ needs to be estimated. The residual value $C_k(f)$ basically corresponds to the frequency components of the carrier frequency $c_k(n)$ of the signal $s_k(n)$ and will be further explained.

Progressing into sub-step S7$k$ of FIG. 3, this sub-step concerns with arriving at the Hilbert envelope $\tilde{s}_k(n)$ which can simply be obtained by performing a time-domain transform of its frequency counterpart $\tilde{T}_k(f)$.

Estimation of the residual value either in the frequency-domain expressed as $C_k(f)$ or in the time-domain expressed as $c_k(n)$ is carried out in sub-step S8$k$ of FIG. 3. In this embodiment, the time-domain residual value $c_k(n)$ is simply derived from a direct division of the original time-domain sub-band signal $s_k(n)$ by its Hilbert envelope $\tilde{s}_k(n)$. Mathematically, it is expressed as follows:

$$c_k(n)=s_k(n)/\tilde{s}_k(n) \quad (6)$$

where all the parameters are as defined above.

It should be noted that Equation (6) is shown a straightforward way of estimating the residual value. Other approaches can also be used for estimation. For instance, the frequency-domain residual value $C_k(f)$ can very well be generated from the difference between the parameters $T_k(f)$ and $\tilde{T}_k(f)$. Thereafter, the time-domain residual value $c_k(n)$ can be obtained by a direct time-domain transform of the value $C_k(f)$.

In FIG. 3, sub-steps S9$k$ and S11$k$ deal with down-shifting the Hilbert carrier $c_k(n)$ towards the baseband frequency. In particular, sub-steps S9$k$ and S10$k$ concern with generating an analytic signal $z_k(t)$. Frequency down-shifting is carried out via the process of heterodyning in sub-step S11$k$. Sub-step S12$k$ and S13$k$ depict a way of selectively selecting values of the down-shifted carrier $c_k(n)$.

Reference is now returned to sub-step S9$k$ of FIG. 3. As is well known in the art, converting a time-domain signal into a complex analytic signal eliminates the negative frequency components in a Fourier transform. Consequently, signal calculation and signal analysis carried out thereafter can be substantially simplified. As in this case, the same treatment is applied to the time-domain residual value $c_k(n)$.

To generate an analytic signal $z_k(n)$ of the time-domain signal $c_k(n)$, a Hilbert transform of the signal $c_k(n)$ needs to be carried out, as shown in step S9$k$ of FIG. 3. The Hilbert transform of the signal $c_k(n)$ is signified by the symbol $\hat{c}_k(n)$ and can be generated from the following algebraic expression:

$$\hat{c}(n) = \frac{1}{\pi}\sum_{n=-\infty}^{\infty}\frac{c_k(\eta)}{n-\eta} \quad (7)$$

where all the parameters are as defined above. Equation (7) basically is a commonly known Hilbert transform equation in the time-domain.

After the Hilbert transform, the analytic signal $z_k(n)$ is simply the summation of the time-domain signal $c_k(t)$ and the imaginary part of the Hilbert transform signal $\hat{c}_k(t)$, as shown in step S10$k$ of FIG. 3. Mathematically, it is expressed as follows:

$$z_k(n)=c_k(n)+j\hat{c}_k(n) \quad (8)$$

where j is an imaginary number

After the derivation of the analytic signal, the process of heterodyning is performed, as shown in sub-step S11$k$ in FIG. 3. In essence, heterodyning is simply a scalar multiplication of the two parameters, that is, the analytic signal $z_k(n)$ and the Hilbert carrier $c_k(n)$. The resultant signal is often called a down-sampled Hilbert carrier $d_k(n)$. As an alternative, the signal $d_k(n)$ can be called a demodulated, down-sampled Hilbert carrier, which basically is a frequency shifted and down-sampled signal of the original Hilbert carrier $c_k(n)$ towards the zero-value or baseband frequency. It should be noted that other terminology for the parameter $d_k(n)$ is also applicable. Such terminology includes demodulated, down-sifted Hilbert carrier, or simply demodulated Hilbert carrier, down-shifted Hilbert carrier, or down-sampled Hilbert carrier. Furthermore, the term "Hilbert" can sometimes be omitted and used instead of the term "Hilbert carrier," it is simply called "carrier." In this specification and appended claims, all these terms as mentioned above are used interchangeably.

Mathematically, the demodulated signal, down-sampled Hilbert carrier, $d_k(n)$ is derived from the following equation:

$$d_k(n)=z_k(Rn)c_k(Rn) \quad (9)$$

where all the terms are as defined above; R is the down-sampling rate.

By down-shifting the frequency of the parameter $c_k(n)$ to arrive at the parameter $d_k(n)$, processing of the Hilbert carrier in each sub-band, such as filtering and thresholding to be described below, can be substantially made easier. Specifically, the offset frequency of the Hilbert carrier in each sub-band need not be determined or known in advance. For instance, in the implementation of a filter algorithm, all the sub-bands can assume one offset frequency, i.e., the baseband frequency.

After the process of frequency down-shifting, the down-sampled Hilbert carrier $d_k(n)$ is then passed through a low-pass filter, as shown in the sub-step S12$k$ of FIG. 3.

It should be noted that the demodulated carrier $d_k(n)$ is complex and analytic. As such, the Fourier transform of the parameter $d_k(n)$ is not conjugate-symmetric. Phrased differently, the process of heterodyning the analytic signal $z_k(n)$ essentially shifts the frequency of the Hilbert carrier $c_k(n)$ as $d_k(n)$ towards the baseband frequency, but without the conjugate-symmetric terms in the negative frequency. As can be seen from the frequency-domain transform $D_k(f)$ of the down-shifted carrier $d_k(n)$ in FIG. 10, in which the parameter $D_k(f)$ is shifted close to the origin denoted by the reference numeral 60. The process of frequency transforming the downshifted carrier $d_k(n)$ into the frequency domain counterpart $D_k(f)$ is depicted in step S13$k$ of FIG. 3.

Figure 10:
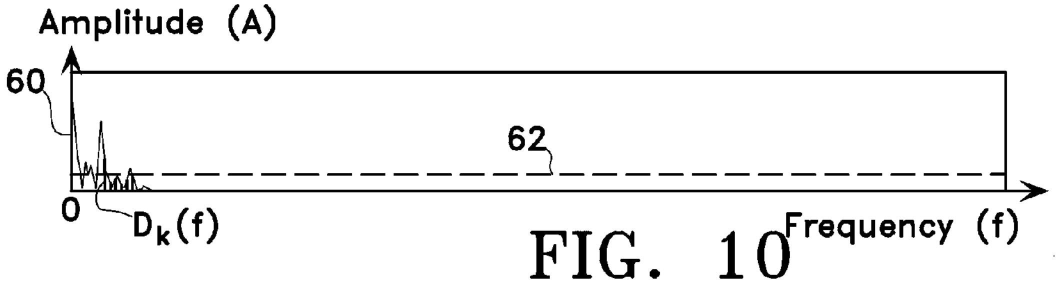
FIG. 10 is a graphical representation of the down-shifted frequency-domain transform of FIG. 8.

Entering into step S14$k$ of FIG. 3, the frequency-domain transform $D_k(f)$ of the demodulated Hilbert carrier $d_k(n)$ is subject to threshold filtering. An exemplary threshold line signified by the reference numeral 62 is as shown in FIG. 10.

In this exemplary embodiment, the threshold is dynamically applied. That is, for each sub-band, the threshold 62 is made adjustable based on other parameters, such as the average and maximum magnitudes of the samples of the parameter $D_k(f)$, and/or the same parameters but of the neighboring sub-bands of the parameter $D_k(f)$. In addition, the parameters can also include the average and maximum magnitudes of the samples of the parameter $D_k(f)$, and/or the same parameters but of the adjacent time-frames of the parameter $D_k(f)$. Furthermore, the threshold can also be dynamically adapted based on the number of coefficients selected. In the exemplary embodiment, only values of the frequency-domain transform $D_k(f)$ above the threshold line 62 are selected.

Thereafter, selected components of the parameter $D_k(f)$ greater than the threshold are quantized. In this example, each selected component includes a magnitude value $b_m(i)$ and a phase value $b_p(i)$, where $0 \leqq i \leqq L-1$. The quantized values $b_m(i)$ and $b_p(i)$ are represented as the quantized values as shown in sub-step S15*k* in FIG. 3.

The quantized values $b_m(i)$ and $b_p(i)$, where i=0 to L−1, of the threshold-filtered parameter $D_k(f)$ will be another part of the encoded information along with the quantized coefficients a(i), where i=0 to K−1, as described above to be sent to the data handler 36 (FIG. 2).

Reference is now returned to FIG. 3. After the Hilbert envelope $\tilde{s}_k(n)$ and the Hilbert carrier $c_k(n)$ information are acquired from the $k^{th}$ sub-band represented as coefficients a(i), $b_m(i)$ and $b_p(i)$ as described above, the acquired information is coded via an entropy coding scheme as shown in step S16*k*.

Thereafter, all the data from each of the M sub-bands are concatenated and packetized, as shown in step S17 of FIG. 3. As needed, various algorithms well known in the art, including data compression and encryption, can be implemented in the packetization process. Afterward, the packetized data can be sent to the data handler 36 (FIG. 2) as shown in step S18 of FIG. 3.

Data can be retrieved from the data handler 36 for decoding and reconstruction. Referring to FIG. 2, during decoding, the packetized data from the data handler 36 are sent to the depacketizer 44 and then undergo the decoding process by the decoder 42. The decoding process is substantially the reverse of the encoding process as described above. For the sake of clarity, the decoding process is not elaborated but summarized in the flow chart of FIG. 15.

During transmission, if data in few of the M frequency sub-bands are corrupted, the quality of the reconstructed signal should not be affected much. This is because the relatively long frame 46 (FIG. 4) can capture sufficient spectral information to compensate for the minor data imperfection.

Figure 13:
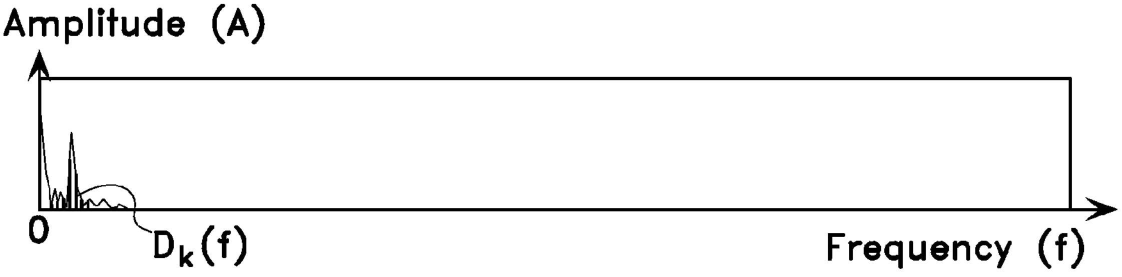
FIG. 13 is a graphical representation of the reconstructed version of the frequency-domain transform of FIG. 10.
Figure 14:
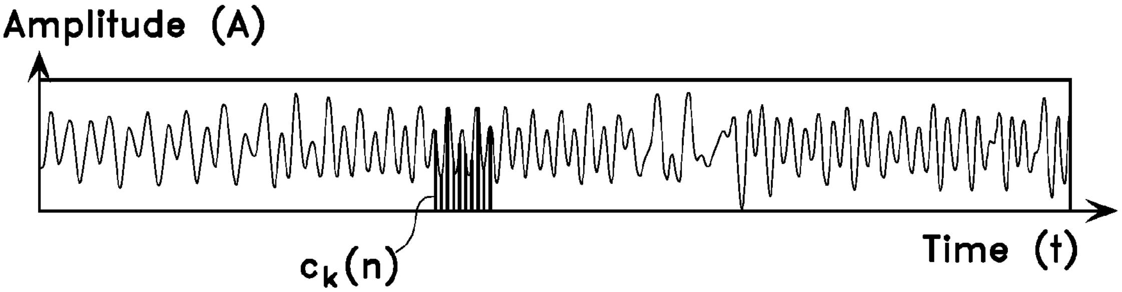
FIG. 14, is a graphical representation of the reconstructed version of the carrier portion signal of FIG. 8.

An exemplary reconstructed frequency-domain transform $D_k(f)$ of the demodulated Hilbert carrier $d_k(t)$ are respectively shown in FIGS. 13 and 14.

Figure 16:
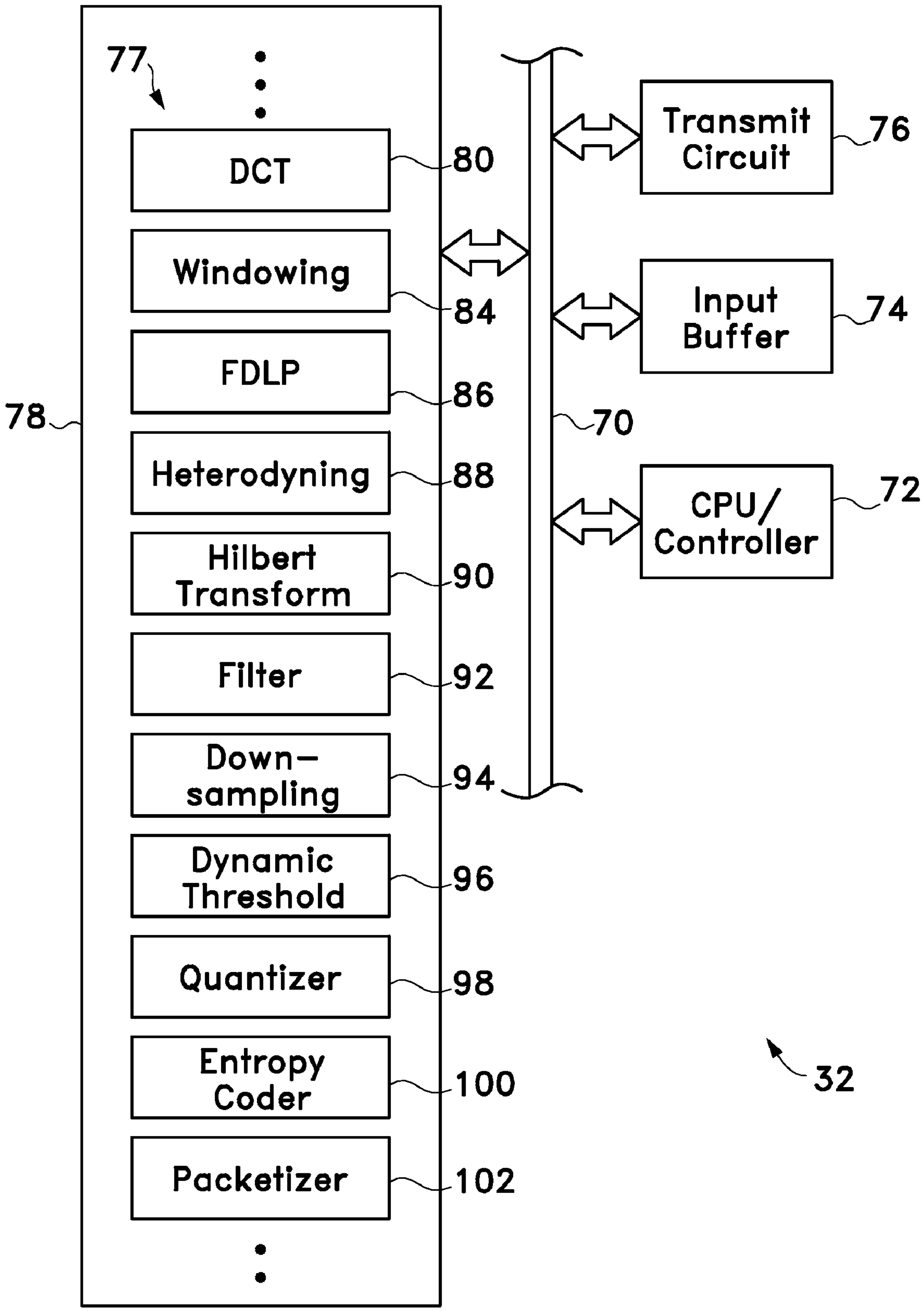
FIG. 16 is a schematic drawing of a part of the circuitry of an encoder in accordance with the exemplary embodiment.
Figure 17:
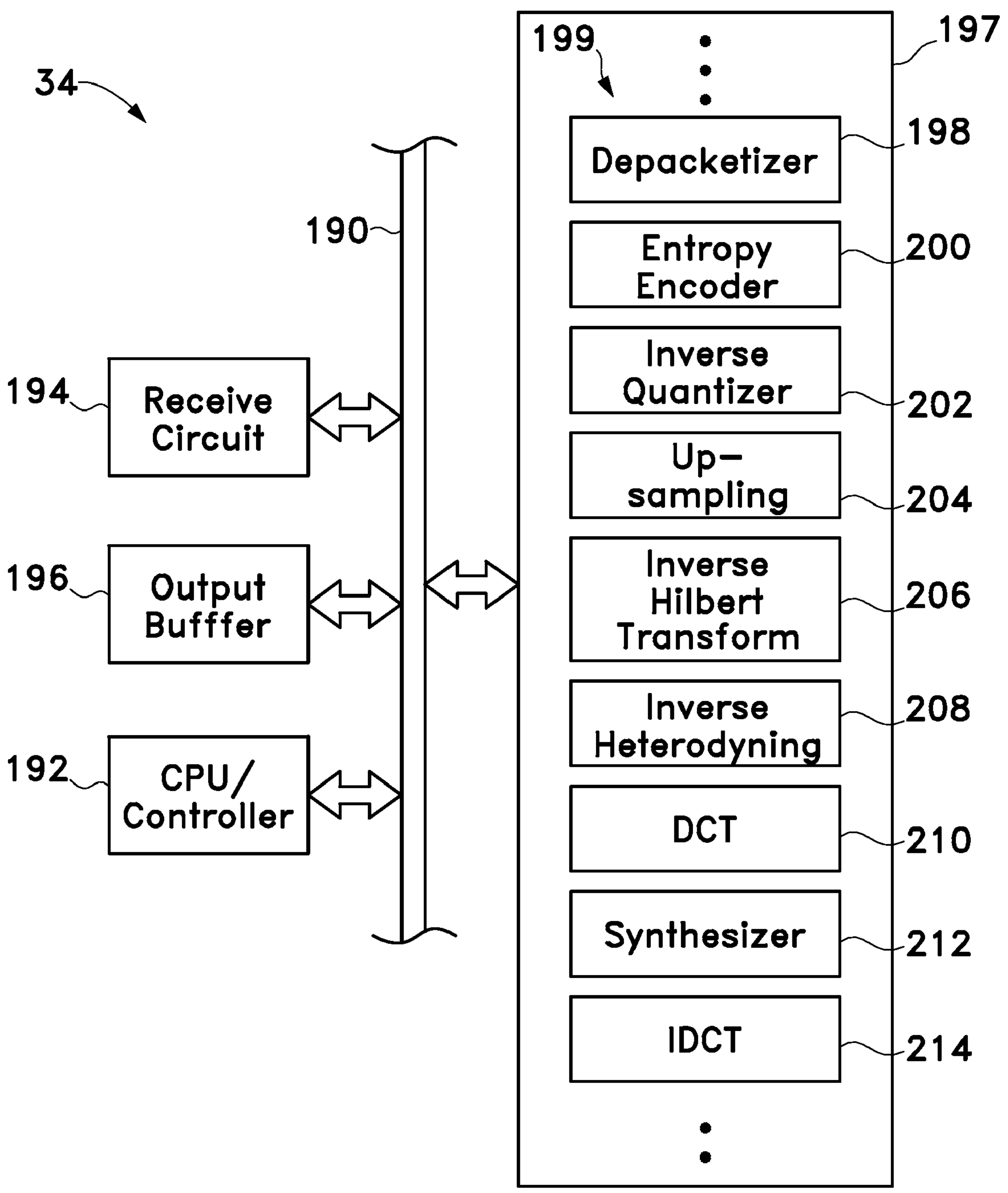
FIG. 17 is a schematic drawing of a part of the circuitry of an decoder in accordance with the exemplary embodiment.

FIGS. 16 and 17 are schematic drawings which illustrate exemplary hardware implementations of the encoding section 32 and the decoding section 34, respectively, of FIG. 2.

Reference is first directed to the encoding section 32 of FIG. 16. The encoding section 32 can be built or incorporated in various forms, such as a computer, a mobile musical player, a personal digital assistant (PDA), a wireless telephone and so forth, to name just a few.

The encoding section 32 comprises a central data bus 70 linking several circuits together. The circuits include a central processing unit (CPU) or a controller 72, an input buffer 74, and a memory unit 78. In this embodiment, a transmit circuit 76 is also included.

If the encoding section 32 is part of a wireless device, the transmit circuit 74 can be connected to a radio frequency (RF) circuit but is not shown in the drawing. The transmit circuit 76 processes and buffers the data from the data bus 70 before sending out of the circuit section 32. The CPU/controller 72 performs the function of data management of the data bus 70 and further the function of general data processing, including executing the instructional contents of the memory unit 78.

Instead of separately disposed as shown in FIG. 12, as an alternative, the transmit circuit 76 can be parts of the CPU/controller 72.

The input buffer 74 can be tied to other devices (not shown) such as a microphone or an output of a recorder.

The memory unit 78 includes a set of computer-readable instructions generally signified by the reference numeral 77. In this specification and appended claims, the terms "computer-readable instructions" and "computer-readable program code" are used interchangeably. In this embodiment, the instructions include, among other things, portions such as the DCT function 80, the windowing function 84, the FDLP function 86, the heterodyning function 88, the Hilbert transform function 90, the filtering function 92, the down-sampling function 94, the dynamic thresholding function 96, the quantizer function 98, the entropy coding function 100 and the packetizer 102.

The various functions have been described, e.g., in the description of the encoding process shown in FIG. 3, and are not further repeated.

Reference is now directed to the decoding section 34 of FIG. 17. Again, the decoding section 34 can be built in or incorporated in various forms as the encoding section 32 described above.

The decoding section 34 also has a central bus 190 connected to various circuits together, such as a CPU/controller 192, an output buffer 196, and a memory unit 197. Furthermore, a receive circuit 194 can also be included. Again, the receive circuit 194 can be connected to a RF circuit (not shown) if the decoding section 34 is part of a wireless device. The receive circuit 194 processes and buffers the data from the data bus 190 before sending into the circuit section 34. As an alternative, the receive circuit 194 can be parts of the CPU/controller 192, rather than separately disposed as shown. The CPU/controller 192 performs the function of data management of the data bus 190 and further the function of general data processing, including executing the instructional contents of the memory unit 197.

The output buffer 196 can be tied to other devices (not shown) such as a loudspeaker or the input of an amplifier.

The memory unit 197 includes a set of instructions generally signified by the reference numeral 199. In this embodiment, the instructions include, among other things, portions such as the depackertizer function 198, the entropy decoder function 200, the inverse quantizer function 202, the up-sampling function 204, the inverse Hilbert transform function 206, the inverse heterodyning function 208, the DCT function 210, the synthesis function 212, and the IDCT function 214.

The various functions have been described, e.g., in the description of the decoding process shown in FIG. 15, and again need not be further repeated.

It should be noted the encoding and decoding sections 32 and 34 are shown separately in FIGS. 16 and 17, respectively. In some applications, the two sections 32 and 34 are very often implemented together. For instance, in a communication device such as a telephone, both the encoding and decoding sections 32 and 34 need to be installed. As such, certain circuits or units can be commonly shared between the sections. For example, the CPU/controller 72 in the encoding section 32 of FIG. 16 can be the same as the CPU/controller 192 in the decoding section 34 of FIG. 17. Likewise, the central data bus 70 in FIG. 16 can be connected or the same as the central data bus 190 in FIG. 17. Furthermore, all the instructions 77 and 199 for the functions in both the encoding and decoding sections 32 and 34, respectively, can be pooled together and disposed in one memory unit, similar to the memory unit 78 of FIG. 16 or the memory unit 197 of FIG. 17.

In this embodiment, the memory unit 78 or 197 is a RAM (Random Access Memory) circuit. The exemplary instruction portions 80, 84, 86, 88, 90, 92, 94, 96, 98, 100, 102, 197, 198, 200, 202, 204, 206, 208, 210, 212 and 214 are software routines or modules. The memory unit 78 or 197 can be tied to another memory circuit (not shown) which can either be of the volatile or nonvolatile type. As an alternative, the memory unit 78 or 197 can be made of other circuit types, such as an EEPROM (Electrically Erasable Programmable Read Only Memory), an EPROM (Electrical Programmable Read Only Memory), a ROM (Read Only Memory), a magnetic disk, an optical disk, and others well known in the art.

Furthermore, the memory unit 78 or 197 can be an application specific integrated circuit (ASIC). That is, the instructions or codes 77 and 199 for the functions can be hard-wired or implemented by hardware, or a combination thereof. In addition, the instructions 77 and 199 for the functions need not be distinctly classified as hardware or software implemented. The instructions 77 and 199 surely can be implemented in a device as a combination of both software and hardware.

Figure 15B:
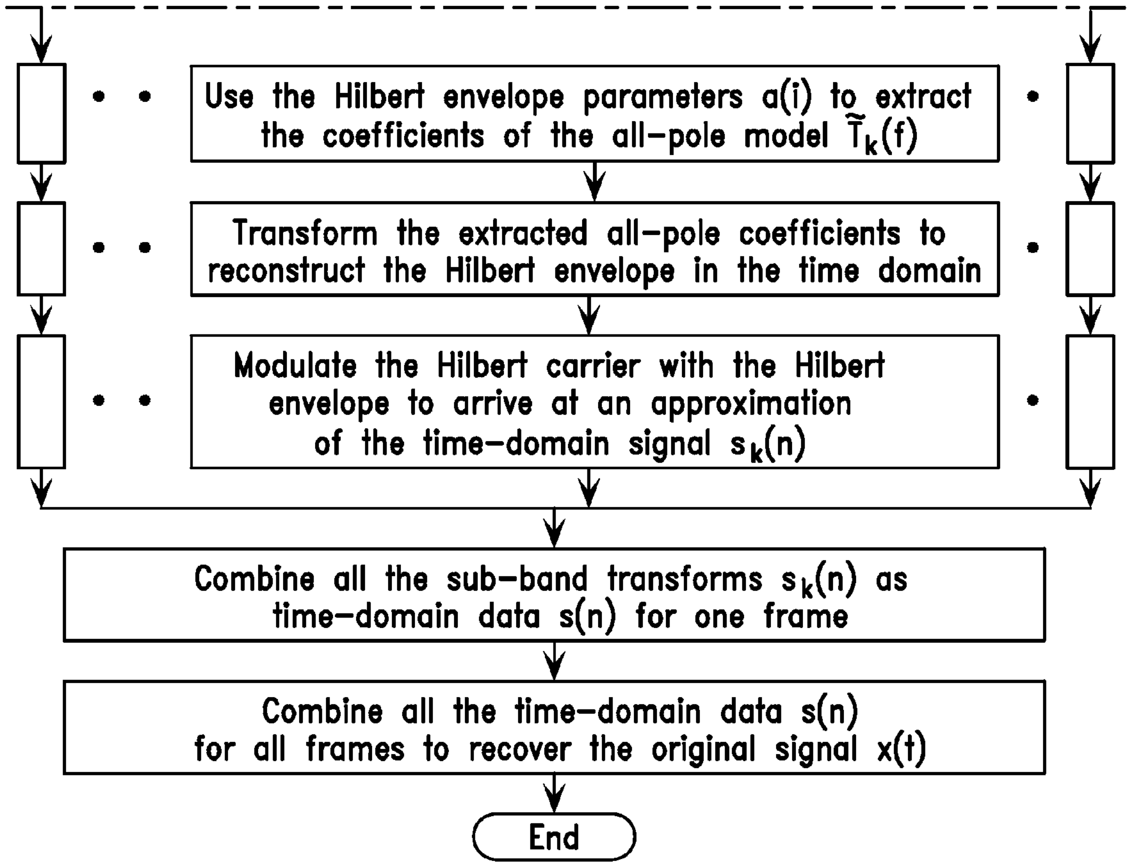
FIG. 15 is flowchart illustrating the steps involved in the decoding process of the exemplified embodiment.

It should be further be noted that the encoding and decoding processes as described and shown in FIGS. 3 and 15 above can also be coded as computer-readable instructions or program code carried on any computer-readable medium known in the art. In this specification and the appended claims, the term "computer-readable medium" refers to any medium that participates in providing instructions to any processor, such as the CPU/controller 72 or 192 respectively shown and described in FIG. 16 or 17, for execution. Such a medium can be of the storage type and may take the form of a volatile or non-volatile storage medium as also described previously, for example, in the description of the memory unit 78 and 197 in FIGS. 16 and 17, respectively. Such a medium can also be of the transmission type and may include a coaxial cable, a copper wire, an optical cable, and the air interface carrying acoustic, electromagnetic or optical waves capable of carrying signals readable by machines or computers. In this specification and the appended claims, signal-carrying waves, unless specifically identified, are collectively called medium waves which include optical, electromagnetic, and acoustic waves.

Finally, other changes are possible within the scope of the invention. In the exemplary embodiment as described, only processing of audio signals is depicted. However, it should be noted that the invention is not so limited. Processing of other types of signals, such as ultra sound signals, are also possible. It also should be noted that the invention can very well be used in a broadcast setting, i.e., signals from one encoder can be sent to a plurality of decoders. Furthermore, the exemplary embodiment as described need not be confined to be used in wireless applications. For instance, a conventional wireline telephone certainly can be installed with the exemplary encoder and decoder as described. In addition, in describing the embodiment, the Levinson-Durbin algorithm is used, other algorithms known in the art for estimating the predictive filter parameters can also be employed. Additionally, any logical blocks, circuits, and algorithm steps described in connection with the embodiment can be implemented in hardware, software, firmware, or combinations thereof. It will be understood by those skilled in the art that theses and other changes in form and detail may be made therein without departing from the scope and spirit of the invention.

What is claimed is:

1. A method for encoding a time-varying signal, comprising:

partitioning said time-varying signal into a plurality of sub-band signals;

determining an envelope and a carrier portion for each of said sub-band signals;

frequency-shifting said carrier portion towards the baseband frequency of said time-varying signal as a down-shifted carrier signal;

selectively selecting values of said down-shifted carrier signal; and including said selected values as encoded data of said time-varying signal.

2. The method as in claim 1 further comprising converting said time-varying signal as a discrete signal prior to encoding.

3. The method as in claim 1 further comprising transforming said time-varying signal into a frequency-domain transform, wherein said plurality of sub-band signals are selected from said frequency-domain transform of said time-varying signal.

4. The method as in claim 3 wherein said envelope and carrier portions are frequency-domain signals, said method further comprising transforming said carrier portion of said frequency-domain signals into a time-domain transform prior to frequency-shifting said carrier portion towards the baseband frequency.

5. A method for decoding a time-varying signal, comprising:

providing a plurality of sets of values corresponding to a plurality of sub-bands of said time-varying signal, said sets of values comprising envelope and carrier information of said time-varying signal;

identifying said carrier information from said plurality of sets of values as a plurality of carrier signals corresponding to said plurality of sub-bands;

frequency-shifting each of said plurality of carrier signals away from the baseband frequency of said time-varying signal as an up-shifted carrier signal; and including said up-shifted carrier signal as decoded data of said time-varying signal.

6. The method as in claim 5 further comprising inverse-heterodyning each of said plurality of carrier signals as an up-shifted carrier signal.

7. The method as in claim 6 further comprising identifying said envelope information from said plurality of sets of values as a plurality of envelope signals corresponding to said plurality of sub-bands, and thereafter modulating said plurality of carrier signals by said plurality of envelope signals as a reconstructed version of said time-varying signal.

8. An apparatus for encoding a time-varying signal, comprising:

means for partitioning said time-varying signal into a plurality of sub-band signals;

means for determining an envelope portion and a carrier portion for each of said sub-band signals;

means for frequency-shifting said carrier portion towards the baseband frequency of said time-varying signal as a down-shifted carrier signal;

means for selectively selecting values of said down-shifted carrier signal; and means for including said selected values as encoded data of said time-varying signal.

9. The apparatus as in claim 8 further comprising means for converting said time-varying signal as a discrete signal prior to encoding.

10. The apparatus as in claim 8 further comprising means for transforming said time-varying signal into a frequency-domain transform, wherein said plurality of sub-band signals are selected from said frequency-domain transform of said time-varying signal.

11. The apparatus as in claim 10 wherein said envelope and carrier portions are frequency-domain signals, said apparatus further comprising means for transforming said carrier portion of said frequency-domain signals into a time-domain transform prior to frequency-shifting said carrier portion towards the baseband frequency.

12. An apparatus for decoding a time-varying signal, comprising:

means for providing a plurality of sets of values corresponding to a plurality of sub-bands of said time-varying signal, said sets of values comprising envelope and carrier information of said time-varying signal;

means for identifying said carrier information from said plurality of sets of values as a plurality of carrier signals corresponding to said plurality of sub-bands;

means for frequency-shifting each of said plurality of carrier signals away from the baseband frequency of said time-varying signal as an up-shifted carrier signal; and means for including said up-shifted carrier signal as decoded data of said time-varying signal.

13. The apparatus as in claim 12 further comprising means for inverse-heterodyning each of said plurality of carrier signals as an up-shifted carrier signal.

14. The apparatus as in claim 12 further comprising means for identifying said envelope information from said plurality of sets of values as a plurality of envelope signals corresponding to said plurality of sub-bands, and means for modulating said plurality of carrier signals by said plurality of envelope signals as a reconstructed version of said time-varying signal.

15. An apparatus for encoding a time-varying signal, comprising:

hardware encoder configured to partition said time-varying signal into a plurality of sub-band signals, determine an envelope and a carrier portion for each of said sub-band signals, frequency-shift said carrier portion towards the baseband frequency of said time-varying signal as a down-shifted carrier signal, and selectively select values of said down-shifted carrier signal; and a hardware data packetizer connected to said hardware encoder for packetizing said selected values as part of encoded data of said time-varying signal.

16. The apparatus as in claim 15 further comprising a transmit circuit connected to said hardware data packetizer for sending said encoded data through a communication channel.

17. An apparatus for decoding a time-varying signal, comprising:

a hardware data depacketizer configured to provide a plurality of sets of values corresponding to a plurality of sub-bands of said time-varying signal, wherein said sets of values comprising envelope and carrier information of said time-varying signal, and further to identify said envelope and carrier information from said plurality of sets of values as a plurality of envelope and carrier signals corresponding to said plurality of sub-bands, frequency-shift each of said plurality of carrier signals away from the baseband frequency of said time-varying signal as an up-shifted carrier signal, and a hardware decoder connected to said hardware data depacketizer, said hardware decoder being configured to transform said set of values into time-domain values.

18. A non-transitory computer program product, comprising:

a computer-readable medium physically embodied with computer-readable program code for:

partitioning said time-varying signal into a plurality of sub-band signals;

determining an envelope and a carrier portion for each of said sub-band signals;

frequency-shifting said carrier portion towards the baseband frequency of said time-varying signal as a down-shifted carrier signal;

selectively selecting values of said down-shifted carrier signal; and including said selected values as encoded data of said time-varying signal.

19. The computer program product as in claim 18 further comprising computer-readable code for converting said time-varying signal as a discrete signal prior to encoding.

20. The computer program product as in claim 18 further comprising computer-readable code for transforming said time-varying signal into a frequency-domain transform, wherein said plurality of sub-band signals are selected from said frequency-domain transform of said time-varying signal.

21. The computer program product as in claim 20 further comprising computer-readable code for transforming said carrier portion of said frequency-domain signals into a time-domain transform prior to frequency-shifting said carrier portion towards the baseband frequency.

22. A non-transitory computer program product, comprising:

a computer-readable medium physically embodied with computer-readable program code for:

providing a plurality of sets of values corresponding to a plurality of sub-bands of said time-varying signal, said sets of values comprising envelope and carrier information of said time-varying signal;

identifying said carrier information from said plurality of sets of values as a plurality of carrier signals corresponding to said plurality of sub-bands;

frequency-shifting each of said plurality of carrier signals away from the baseband frequency of said time-varying signal as an up-shifted carrier signal; and including said up-shifted carrier signal as decoded data of said time-varying signal.

23. The computer product as in claim 22 further comprising computer-readable code for inverse-heterodyning each of said plurality of carrier signals as an up-shifted carrier signal.

24. The computer product as in claim 22 further comprising computer-readable code for identifying said envelope information from said plurality of sets of values as a plurality of envelope signals corresponding to said plurality of sub-bands, and thereafter modulating said plurality of carrier signals by said plurality of envelope signals as a reconstructed version of said time-varying signal.

25. An apparatus encoding a time-varying signal, comprising:

a processor configured to execute a set of instructions; and a memory, coupled to the processor, embodying the set of instructions that when executed by the processor cause the processor to: encode said time-varying signal into a plurality of sub-band signals, determine an envelope and a carrier portion of each of said sub-band signals, frequency-shift said carrier portion towards the baseband frequency of said time-varying signal as a down-shifted carrier signal, and selectively select values of said down-shifted carrier signal, and packetize the selected values as part of encoded data of said time-varying signal.

26. The apparatus of claim 25, further comprising a transmit circuit connected to the processor for sending said encoded data through a communication channel.

27. An apparatus for decoding a time-varying signal, comprising:

a processor configured to execute a set of instructions; and a memory, coupled to the processor, embodying the set of instructions that when executed by the processor cause the processor to: de-packetize a sets of values corresponding to a plurality of sub-bands of said time-varying signal, wherein said sets of values comprise envelope and carrier information of said time-varying signal, and further to identify said envelope and carrier information from said plurality sets of values as a plurality of envelope and carrier signals corresponding to said plurality of sub-bands, frequency-shift each of said plurality of carrier signals away from the baseband frequency of said time-varying signal as an up-shifted carrier signal, and a decoder connected to said data de-packetizer, said decoder being configured to transform said set of values into time-domain values.

* * * * *